(12) United States Patent
Wang et al.

(10) Patent No.: US 11,069,866 B2
(45) Date of Patent: Jul. 20, 2021

(54) ACTIVE DEVICE SUBSTRATE

(71) Applicant: Au Optronics Corporation, Hsinchu (TW)

(72) Inventors: Pei-Yun Wang, Taoyuan (TW); Chia-Kai Chen, Taichung (TW)

(73) Assignee: Au Optronics Corporation, Hsinchu (TW)

( * ) Notice: Subject to any disclaimer, the term of this patent is extended or adjusted under 35 U.S.C. 154(b) by 61 days.

(21) Appl. No.: 16/457,935

(22) Filed: Jun. 29, 2019

(65) Prior Publication Data
US 2020/0013970 A1    Jan. 9, 2020

(30) Foreign Application Priority Data
Jul. 9, 2018  (TW) .................. 107123668

(51) Int. Cl.
*H01L 51/00*    (2006.01)
*H01L 27/32*    (2006.01)

(52) U.S. Cl.
CPC ...... *H01L 51/0097* (2013.01); *H01L 27/3246* (2013.01); *H01L 27/3258* (2013.01); *H01L 27/3262* (2013.01); *H01L 27/3276* (2013.01); H01L 2227/323 (2013.01); H01L 2251/5338 (2013.01); H01L 2251/558 (2013.01)

(58) Field of Classification Search
CPC ............. H01L 51/0097; H01L 27/3276; H01L 2251/5338; H01L 2251/5392
See application file for complete search history.

(56) References Cited

U.S. PATENT DOCUMENTS

| | | |
|---|---|---|
| 10,361,385 B2 | 7/2019 | Choi et al. |
| 10,692,953 B2 | 6/2020 | Yoon et al. |
| 2014/0055702 A1 | 2/2014 | Park et al. |
| 2014/0232956 A1* | 8/2014 | Kwon ................. H01L 27/3276 349/12 |

(Continued)

FOREIGN PATENT DOCUMENTS

| | | |
|---|---|---|
| CN | 105826350 | 8/2016 |
| CN | 107086236 | 8/2017 |

(Continued)

OTHER PUBLICATIONS

"Office Action of China Counterpart Application", dated Apr. 3, 2020, p. 1-7.

*Primary Examiner* — Stephen M Bradley
(74) *Attorney, Agent, or Firm* — JCIPRNET

(57) ABSTRACT

An active device substrate including a flexible substrate, an inorganic insulation layer, an organic insulation pattern, a conductive device and a peripheral wiring is provided. The flexible substrate has an active region, a peripheral region outside the active region and a bending region connected between the active region and the peripheral region. The inorganic insulation layer is disposed on the flexible substrate and has a groove disposed in the bending region. The organic insulation pattern is disposed in the groove of the inorganic insulation layer. The peripheral wiring is extended from the active region to the conductive device in the peripheral region. The peripheral wiring is disposed on the organic insulation pattern, and the organic insulation pattern is located between the peripheral wiring and the flexible substrate.

18 Claims, 21 Drawing Sheets

(56) References Cited

U.S. PATENT DOCUMENTS

| | | | | |
|---|---|---|---|---|
| 2016/0218305 A1* | 7/2016 | Kim | ................... | G02F 1/1345 |
| 2017/0263887 A1 | 9/2017 | Han et al. | | |
| 2018/0013095 A1* | 1/2018 | Choi | ................... | H01L 27/3297 |
| 2018/0047802 A1* | 2/2018 | Yoon | ................... | H01L 27/3262 |
| 2018/0331319 A1* | 11/2018 | Hiraga | ................ | H01L 27/3276 |
| 2019/0181198 A1* | 6/2019 | Son | ................... | H01L 27/3262 |
| 2020/0273944 A1 | 8/2020 | Yoon et al. | | |

FOREIGN PATENT DOCUMENTS

| | | |
|---|---|---|
| CN | 107731869 | 2/2018 |
| TW | 201736913 | 10/2017 |

\* cited by examiner

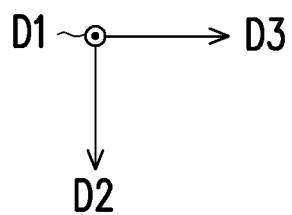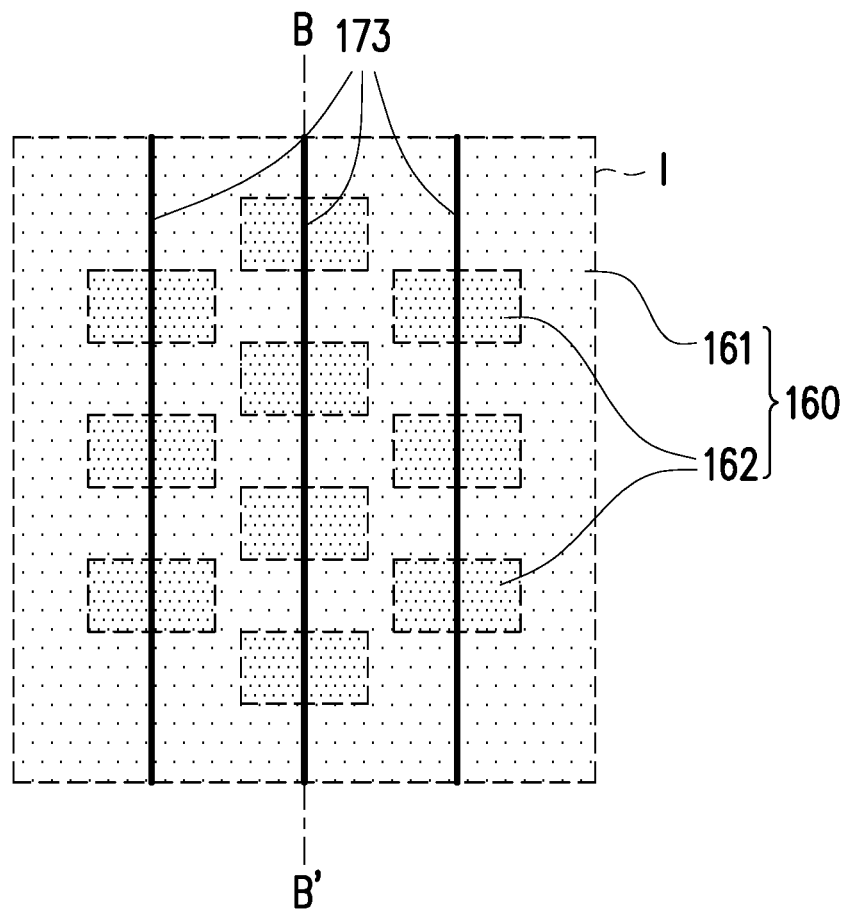
FIG. 2

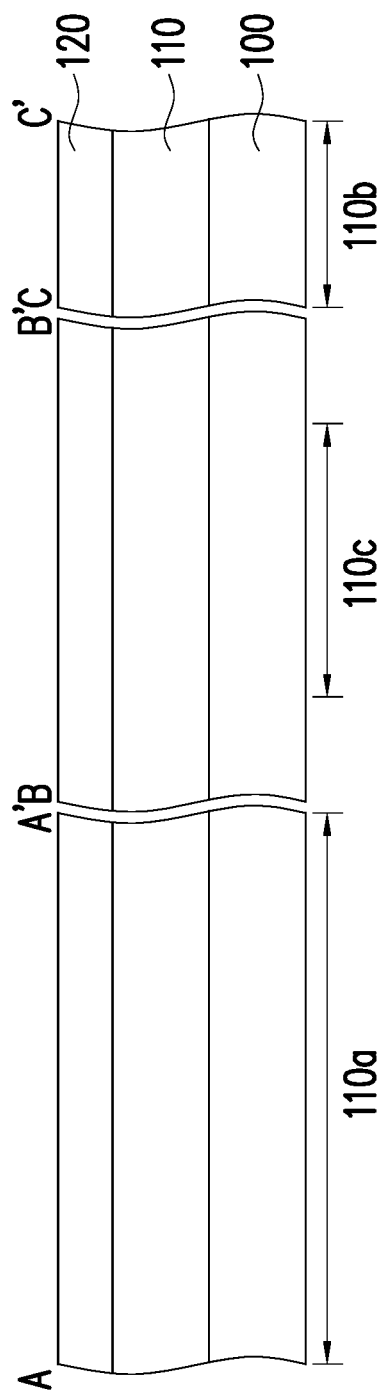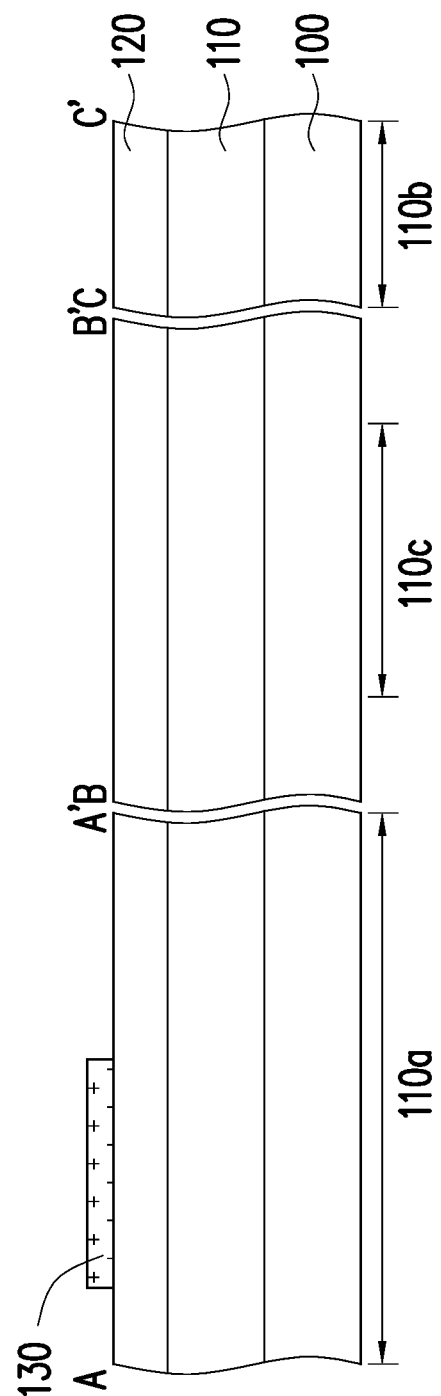

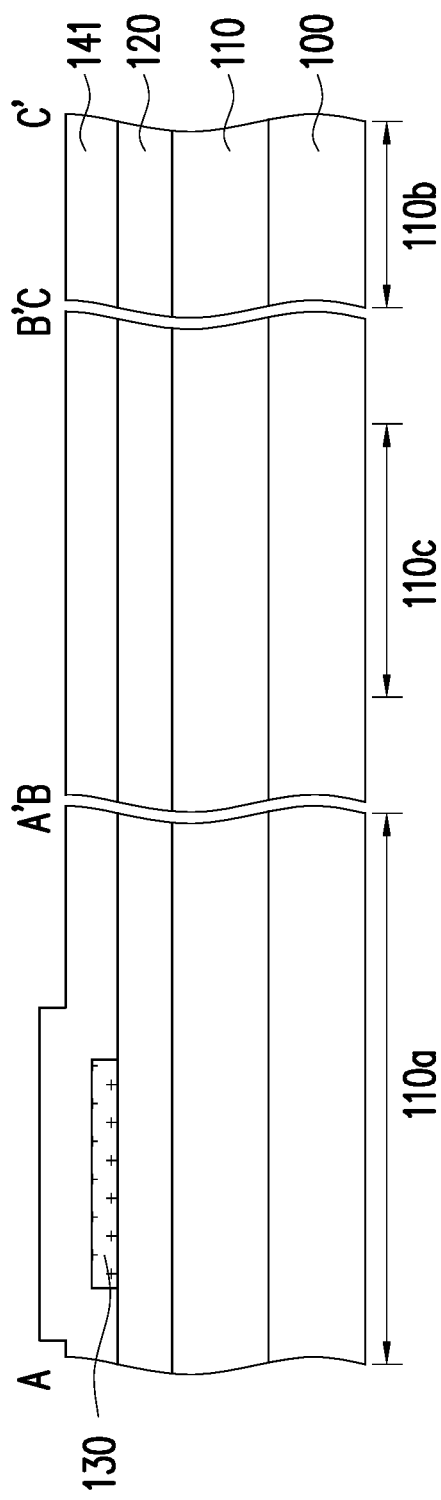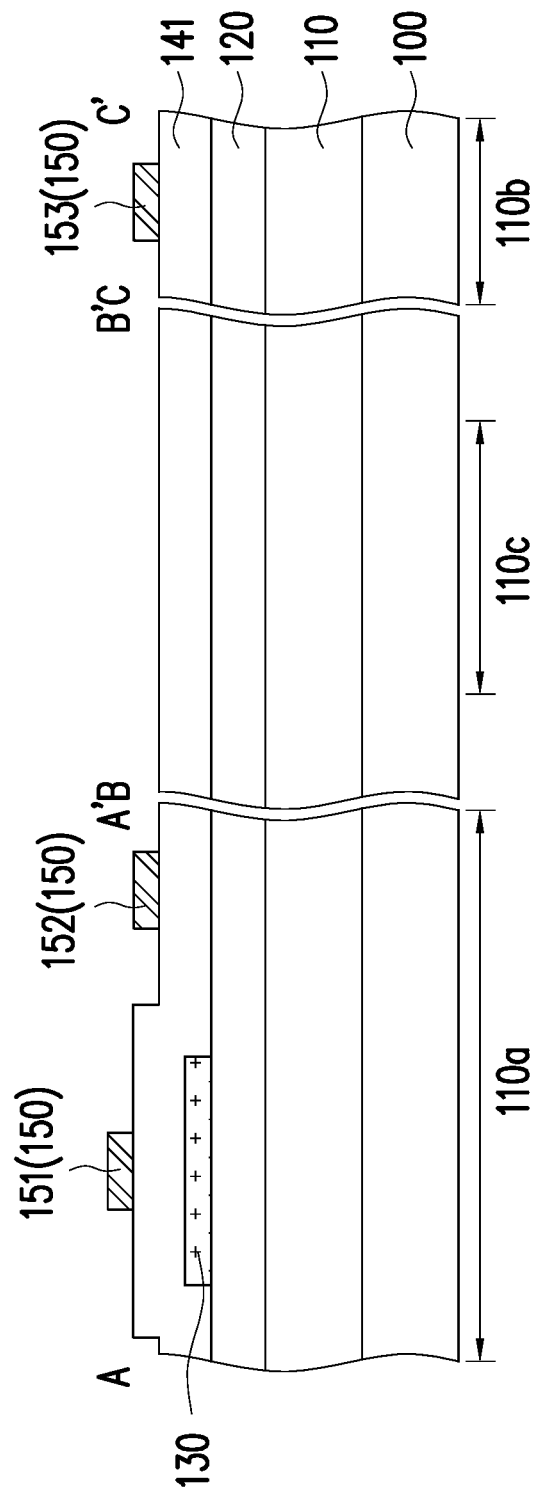

ACTIVE DEVICE SUBSTRATE

CROSS REFERENCE TO RELATED APPLICATION

This application claims the priority benefit of Taiwan application serial no. 107123668, filed on Jul. 9, 2018. The entirety of the above-mentioned patent application is hereby incorporated by reference herein and made a part of specification.

BACKGROUND

Field of the Disclosure

The disclosure is related to a device substrate, and particularly to an active device substrate.

Description of Related Art

Along with advancement of display technologies, the application of display panel is expanded. For example, in early stage, display panel mainly serves as the screen of electronic devices (e.g., TV, computer, cell phone, etc.), and display panels applied to electronic device are mostly rigid display panels. Lately, some manufacturers apply display panel to wearable devices (e.g., watch, clothing, etc.), and display panels applied to wearable devices are mostly flexible display panels.

Flexible display panel needs to be bendable to a certain extent. In other words, when the flexible display panel is bent, components (e.g., thin film transistor, data line, scan line, peripheral wiring, etc.) on the flexible substrate are bent as well and maintain normal functions. However, in conventional flexible display panels, a flexible pixel array substrate includes at least one full layer of inorganic insulation layer. When the flexible display panel is bent, the fragile inorganic insulation layer is easily cracked, which causes adjacent layer (e.g., first conductive layer, second conductive layer, etc.) to be cracked, thus leading to failure of flexible display panel.

SUMMARY OF THE DISCLOSURE

The disclosure provides an active device substrate, which has good bending tolerance.

An active device substrate of the disclosure includes a flexible substrate, an inorganic insulation layer, an organic insulation pattern, a conductive device and a peripheral wiring. The flexible substrate has an active region, a peripheral region outside the active region and a bending region connected between the active region and the peripheral region. The inorganic insulation layer is disposed on the flexible substrate and has a first groove disposed in the bending region. The organic insulation pattern is disposed in the first groove of the inorganic insulation layer. The conductive device is disposed on the peripheral region. The peripheral wiring is extended from the active region to the conductive device on the peripheral region. The peripheral wiring in the bending region is disposed on the organic insulation pattern, and the organic insulation pattern is disposed between the peripheral wiring and the flexible substrate.

According to an embodiment of the disclosure, the active device substrate further includes a thin film transistor disposed in the active region. The thin film transistor includes a semiconductor pattern, a gate, a source and a drain. The semiconductor pattern is disposed on the flexible substrate. The source and the drain are disposed above the gate and electrically connected to the semiconductor pattern.

According to an embodiment of the disclosure, the inorganic insulation layer of the active device substrate includes a first insulation layer and a second insulation layer. The first insulation layer covers the semiconductor pattern. The second insulation layer covers the gate and the first insulation layer, wherein the first groove penetrates through the first insulation layer and the second insulation layer.

According to an embodiment of the disclosure, the inorganic insulation layer of the active device substrate further has a first through hole and a second through hole. The source and the drain are disposed on the inorganic insulation layer and respectively electrically connected to the semiconductor pattern through the first through hole and the second through hole. The peripheral wiring, the source and the drain belong to an identical layer.

According to an embodiment of the disclosure, the organic insulation pattern of the active device substrate has an upper surface facing away from the flexible substrate. The second insulation layer has an upper surface facing away from the flexible substrate. A distance between the upper surface of the organic insulation pattern and the flexible substrate is larger than or equal to a distance between the upper surface of the second insulation layer and the flexible substrate.

According to an embodiment of the disclosure, the upper surface of the organic insulation pattern of the active device substrate has a plurality of protrusions. The peripheral wiring is conformally disposed on the plurality of protrusions.

According to an embodiment of the disclosure, the active device substrate further includes a planarization layer, a first electrode and a pixel defining layer. The planarization layer covers the thin film transistor. The first electrode is disposed on the planarization layer and electrically connected to the drain of the thin film transistor. The pixel defining layer is disposed on the planarization layer and the first electrode and has an opening overlapped with a portion of the first electrode.

According to an embodiment of the disclosure, the planarization layer of the active device substrate covers the peripheral wiring, and the pixel defining layer covers the planarization layer on the peripheral wiring.

According to an embodiment of the disclosure, the material of the planarization layer of the active device substrate, the material of the pixel defining layer and the material of the organic insulation pattern are the same.

According to an embodiment of the disclosure, the active device substrate further includes a third insulation layer. The third insulation layer covers the peripheral wiring and the second insulation layer. The flexible substrate has a thickness $H_1$ and a Young's modulus $E_1$. The first groove has a depth $H_2$. The organic insulation pattern has a Young's modulus $E_2$.

The third insulation layer has a thickness $H_3$ and a Young's modulus $E_3$, wherein $H_1 \cdot E_1 + H_2 \cdot E_2 \leq H_3 \cdot E_3$.

According to an embodiment of the disclosure, the active device substrate further includes a buffer layer. The buffer layer has a thin portion covering the bending region of the flexible substrate, wherein the organic insulation pattern is disposed on the thin portion of the buffer layer. The thin portion of the buffer layer has a thickness $H_4$ and a Young's modulus $E_4$, wherein $H_1 \cdot E_1 + H_2 \cdot E_2 + H_4 \cdot E_4 \leq H_3 \cdot E_3$.

According to an embodiment of the disclosure, the organic insulation pattern of the active device substrate has a plurality of protrusions. Each of the protrusions is protruded toward a first direction away from the flexible substrate, and the peripheral wiring is disposed on the plurality of protrusions.

According to an embodiment of the disclosure, the peripheral wiring of the active device substrate has a plurality of curved sections. Each of the curved sections is bent toward a second direction, and the first direction interlaces with the second direction.

According to an embodiment of the disclosure, the plurality of protrusions of the organic insulation pattern of the active device substrate are arranged in a plurality of rows. Two adjacent rows of protrusions of are staggered.

According to an embodiment of the disclosure, the peripheral wiring of the active device substrate has a plurality of curved sections, and the plurality of curved sections of the peripheral wiring are respectively disposed on the plurality of protrusions of the organic insulation pattern.

According to an embodiment of the disclosure, the organic insulation pattern of the active device substrate further includes a base. The base is disposed in the first groove of the inorganic insulation layer. The plurality of protrusions are disposed on the surface of the base. An angle θ is formed between a side wall of each of the protrusions and the surface of the base, and $100° \leq θ \leq 160°$.

According to an embodiment of the disclosure, the organic insulation pattern of the active device substrate further includes a base. The base is disposed in the first groove of the inorganic insulation layer. The plurality of protrusions are disposed on the surface of the base. The protrusion has a thickness h. A sum of the thickness h and the thickness of the base is H, and $0.5 \ \mu m \leq h \leq 2.5 \ \mu m$, and $1 \ \mu m \leq H \leq 5 \ \mu m$.

According to an embodiment of the disclosure, the flexible substrate of the active device substrate has an inner surface and an outer surface opposite to each other. The thin film transistor is disposed on the inner surface of the flexible substrate. The active device substrate further includes a protecting film disposed on the outer surface of the flexible substrate, wherein the protecting film is overlapped with the active region and the peripheral region without being overlapped with the bending region.

According to an embodiment of the disclosure, along a direction directing from the active region to the peripheral region, the first groove has a width L0 μm, the bending region has a width L1 μm, and $L1+20 \ \mu m \leq L0 \leq 3 \cdot L1$.

Based on the above, the active device substrate in the embodiment of the disclosure is provided with the organic insulation pattern in the first groove of the bending region. The peripheral wiring is disposed on the organic insulation pattern to cross the bending region and is extended from the active region to the peripheral region. Since the material of the organic insulation pattern is softer and not easily cracked due to bending, when the bending region is bent, the peripheral wiring is not easily affected by the organic insulation pattern to be cracked, and thus the active device substrate has good bending tolerance.

In order to make the aforementioned features and advantages of the disclosure more comprehensible, embodiments accompanying figures are described in detail below.

BRIEF DESCRIPTION OF THE DRAWINGS

FIG. 2 is an enlarged schematic top view of a portion I of a bending region 110c of the active device substrate 10 in FIG. 1.

DESCRIPTION OF EMBODIMENTS

Figure 1:
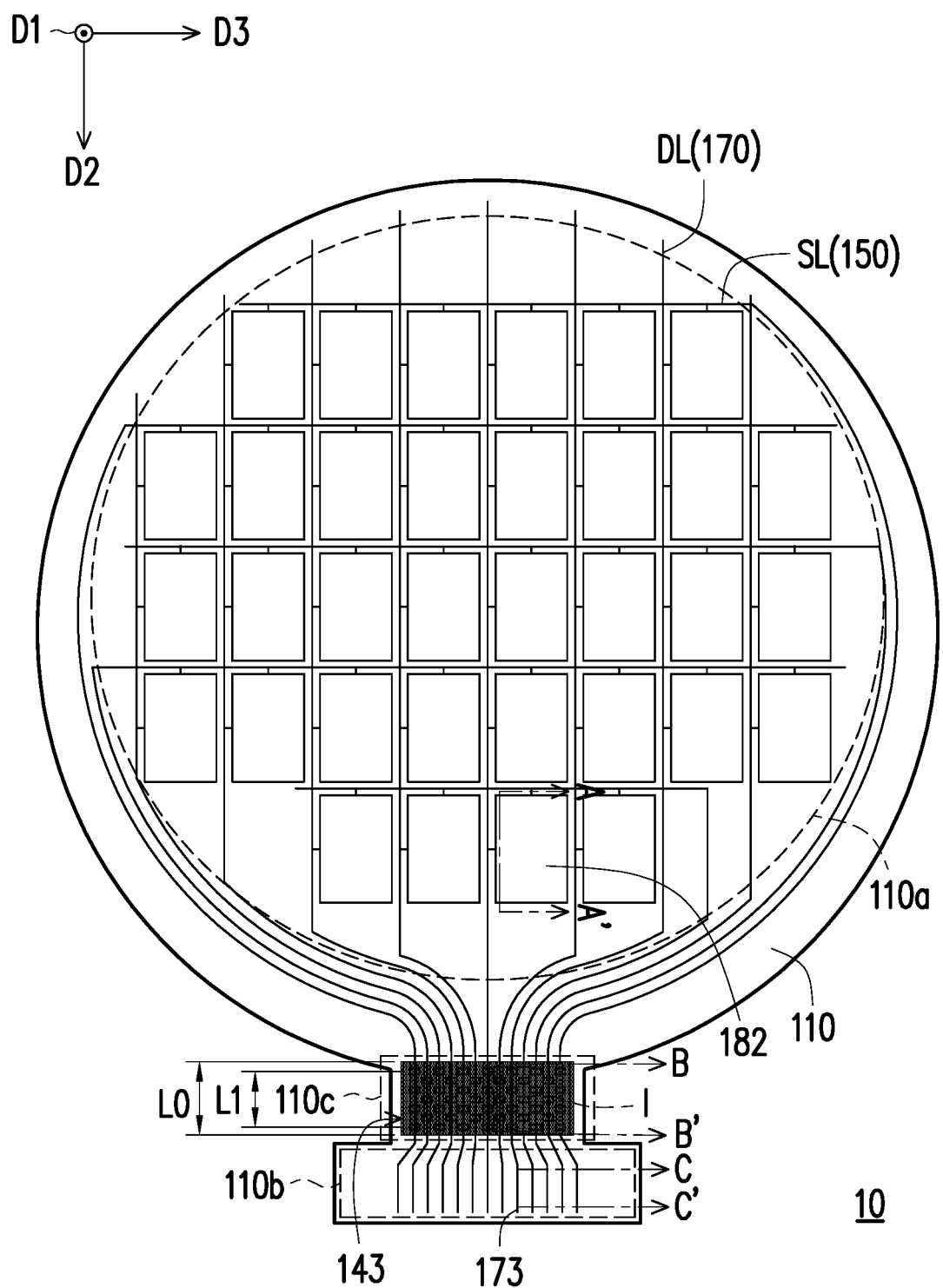
FIG. 1 is a schematic top view of an active device substrate 10 according to an embodiment of the disclosure.

In order to make the disclosure more comprehensible, embodiments are described below as the examples to prove that the disclosure can actually be realized. In addition, wherever possible, the same reference numerals in drawings and embodiments represent the same or similar parts.

FIG. 1 is a schematic top view of an active device substrate 10 according to an embodiment of the disclosure. FIG. 2 is an enlarged schematic top view of a portion I of a bending region 110c of the active device substrate 10 in FIG. 1. FIG. 3A to FIG. 3Q are schematic cross-sectional views of a manufacturing process of an active device substrate according to an embodiment of the disclosure. Specifically, FIG. 3Q respectively corresponds to sectional lines A-A', B-B' and C-C' taken along FIG. 1, and FIG. 1 omits illustration of a pixel defining layer 190, a light emitting layer 192 and a conductive device 153 in FIG. 3Q. FIG. 1, FIG. 2 and FIG. 3A-FIG. 3Q are illustrated to describe the manufacturing process and structure of the active device substrate 10 in an embodiment of the disclosure.

Referring to FIG. 1 and FIG. 3A, first of all, a flexible substrate 110 is provided. In the embodiment, the flexible substrate 110 may be temporarily disposed on a rigid carrier board 100. For example, in the embodiment, the material of the rigid carrier board 100 may be glass or other material that is not easily deformed and has high manufacturing tolerance. The flexible substrate 110 has an active region 110a, a peripheral region 110b outside the active region 110a and a bending region 110c connected between the active region 110a and the peripheral region 110b. In the embodiment, the bending region 110c may be, for example, a width reducing portion of the flexible substrate 110. For example, the flexible substrate 110 may selectively have the active region 110a in round shape, the bending region 110c in straight bar shape connected under the active region 110a and the peripheral region 110b in horizontal bar shape connected under the bending region 110c. In general, the flexible substrate 110 may be formed in a substantially head-shape and a substantially neck-shape, and the bending region 110c may be a neck portion of the flexible substrate 110, the disclosure is not limited thereto. In other embodiments, various regions of the flexible substrate 110 may be designed with other suitable shapes depending on actual needs.

In the embodiment, the material of the flexible substrate 110 may be selected from an organic polymer such as polyimide (PI), polyethylene naphthalate (PEN), polyethylene terephthalate (PET), polycarbonates (PC), polyether sulfone (PES), polyarylate, or other suitable material, the disclosure is not limited thereto.

Referring to FIG. 3A, next, a buffer layer 120 may be selectively formed on the flexible substrate 110. In the embodiment, the buffer layer 120 may cover the active region 110a, the bending region 110c and the peripheral region 110b of the flexible substrate 110, the disclosure is not limited thereto. For example, in the embodiment, the material of the buffer layer 120 may be silicon oxide, silicon nitride, silicon oxynitride, other suitable material, or a stacked layer of at least two of the above materials, the disclosure provides no limitation thereto.

Referring to FIG. 3B, thereafter, a semiconductor pattern 130 is formed on the buffer layer 120. In the embodiment, the semiconductor pattern 130 may be a single-layered or a multi-layered structure including amorphous silicon, poly-silicon, microcrystalline silicon, mono-crystalline silicon, an organic semiconductor material, an oxide semiconductor material (e.g., indium-zinc-oxide, indium-gallium-zinc-oxide, other suitable material, or a combination of the above), other suitable material, or contain dopant in the above materials, or a combination of the above, the disclosure provides no limitation thereto.

Referring to FIG. 3C, afterwards, a first insulation layer 141 is formed to cover the semiconductor pattern 130 and the buffer layer 120. Referring to FIG. 3D, next, a first conductive layer 150 is formed on the first insulation layer 141. In the embodiment, the first conducive layer 150 may include a gate 151 disposed on the active region 110a, a connecting device 152 disposed on the active region 110a and a conductive device 153 disposed on the peripheral region 110b. Referring to FIG. 1 and FIG. 3D, for example, in the embodiment, the first conductive layer 150 may further include a plurality of scan lines SL. The scan line SL is electrically connected to the gate 151. In the embodiment, in consideration of conductivity, the first conductive layer 150 (or gate 151, connecting device 152, conductive device 153, and scan line SL) is typically manufactured by using a metal material, the disclosure provides no limitation thereto. According to other embodiments, the first conductive layer 150 may be manufactured by using other suitable conductive material such as alloy, nitride of metal material, oxide of metal material, oxynitride of metal material, or a stacked layer of metal material and other conductive material.

Figure 3E:
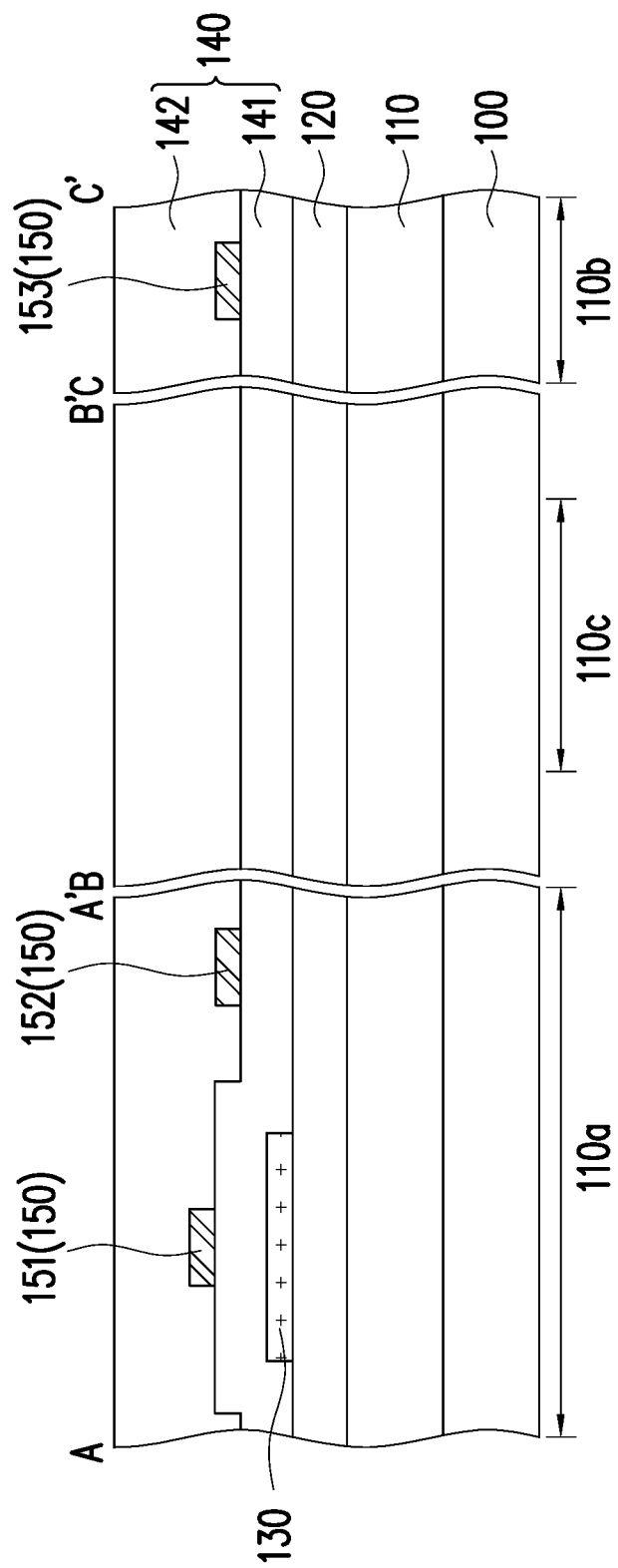
FIG. 3A to FIG. 3Q are schematic cross-sectional views of a manufacturing process of an active device substrate according to an embodiment of the disclosure.

Referring to FIG. 3E, thereafter, a second insulation layer 142 is formed to cover the gate 151, the connecting device 152, the conductive device 153 and the scan line SL (shown in FIG. 1). In the embodiment, the material of the first insulation layer 141 and the material of the second insulation layer 142 may be inorganic material, and the first insulation layer 141 and the second insulation layer 142 may constitute the inorganic insulation layer 140. For example, in the embodiment, the material of the first insulation layer 141 and the material of the second insulation layer 142 are, for example, silicon oxide, silicon nitride, silicon oxynitride, other suitable inorganic material, or a stacked layer of at least two of the above materials, the disclosure is not limited thereto. In the embodiment, the material of the first insulation layer 141 and the material of the second insulation layer 142 may be the same, the disclosure is not limited thereto.

Figure 3F:
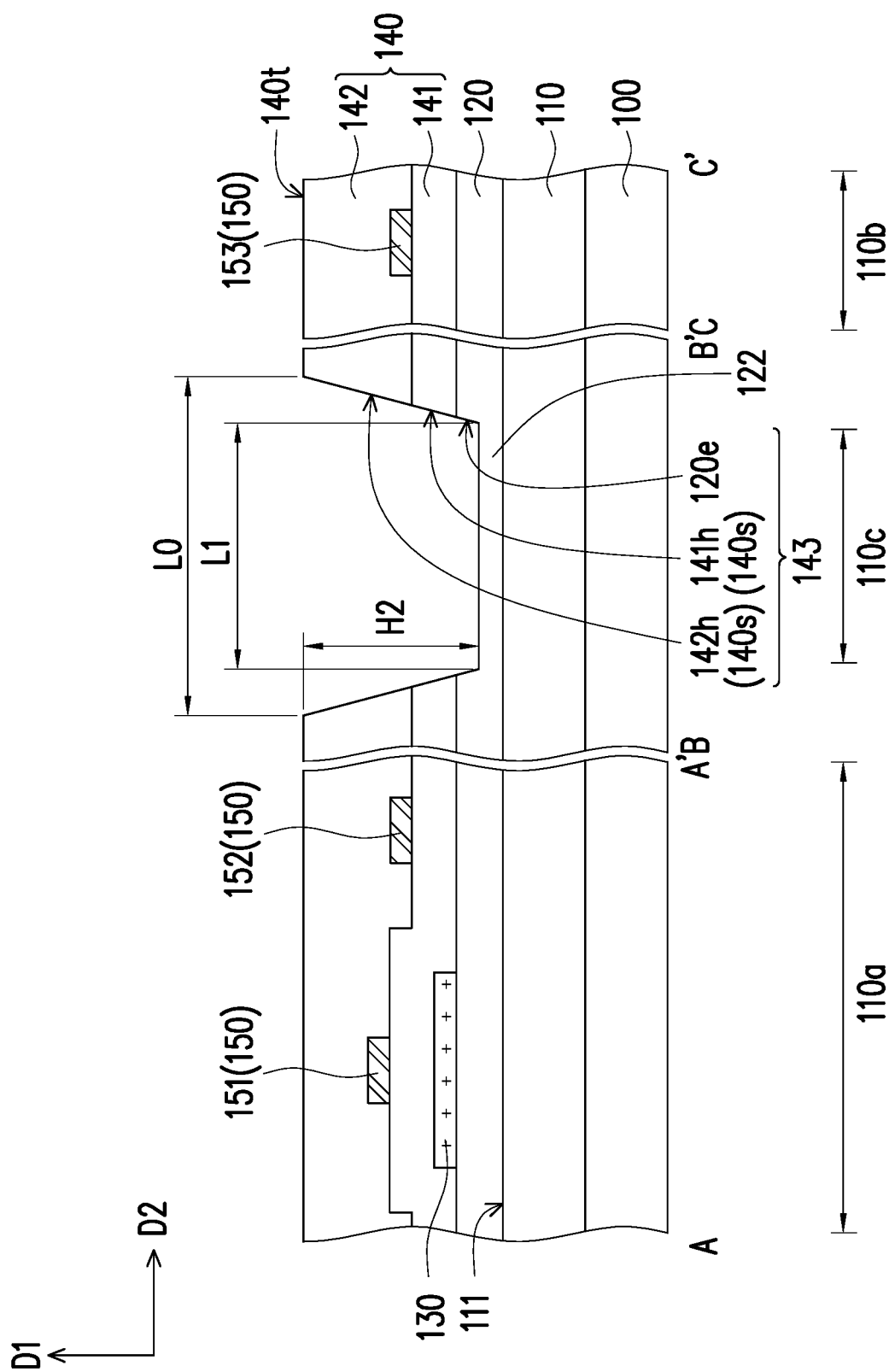

Referring to FIG. 3F, next, a first groove 143 is formed above the bending region 110c of the flexible substrate 110. In the embodiment, the first groove 143 penetrates through the first insulation layer 141 and the second insulation layer 142 without penetrating through the buffer layer 120. For example, in the embodiment, an identical mask (not shown) may be used to pattern the first insulation layer 141, the second insulation layer 142 and the buffer layer 120 to form a through hole 142h of the second insulation layer 142, a through hole 141h of the first insulation layer 141 and a recess 120e of the buffer layer 120. The through hole 142h, the through hole 141h and the recess 120e are communicated and substantially aligned with each other to form the first groove 143 of the embodiment. Along a first direction D1, the first groove 143 has a depth H2, wherein the first direction D1 is parallel with a normal direction of the inner surface 111 of the substrate 110. Along a second direction D2, the first groove 143 has a width L0, wherein the second direction D2 is directed from the top of the active region 110a to the top of the peripheral region 110b and is perpendicular to the first direction D1.

Referring to FIG. 1 and FIG. 3F, in the embodiment, the inorganic insulation layer 140 has a side wall 140s defining the first groove 143 and an upper surface 140t facing away from the substrate 110. A boundary between the side wall 140s and the upper surface 140t constitutes a contour of the first groove 143, and the width L0 may refer to the width of the contour along the second direction D2. For example, in the embodiment, the width of the bending region 110c along the second direction D2 is L1 µm, and the width of the first groove 143 along the second direction D2 is L0 µm, and L1 and L0 may satisfy the following equation: L1+5 µm<L0<5·L1, and preferably L1+20 µm≤L0≤3·L1, the disclosure is not limited thereto.

Figure 3G:
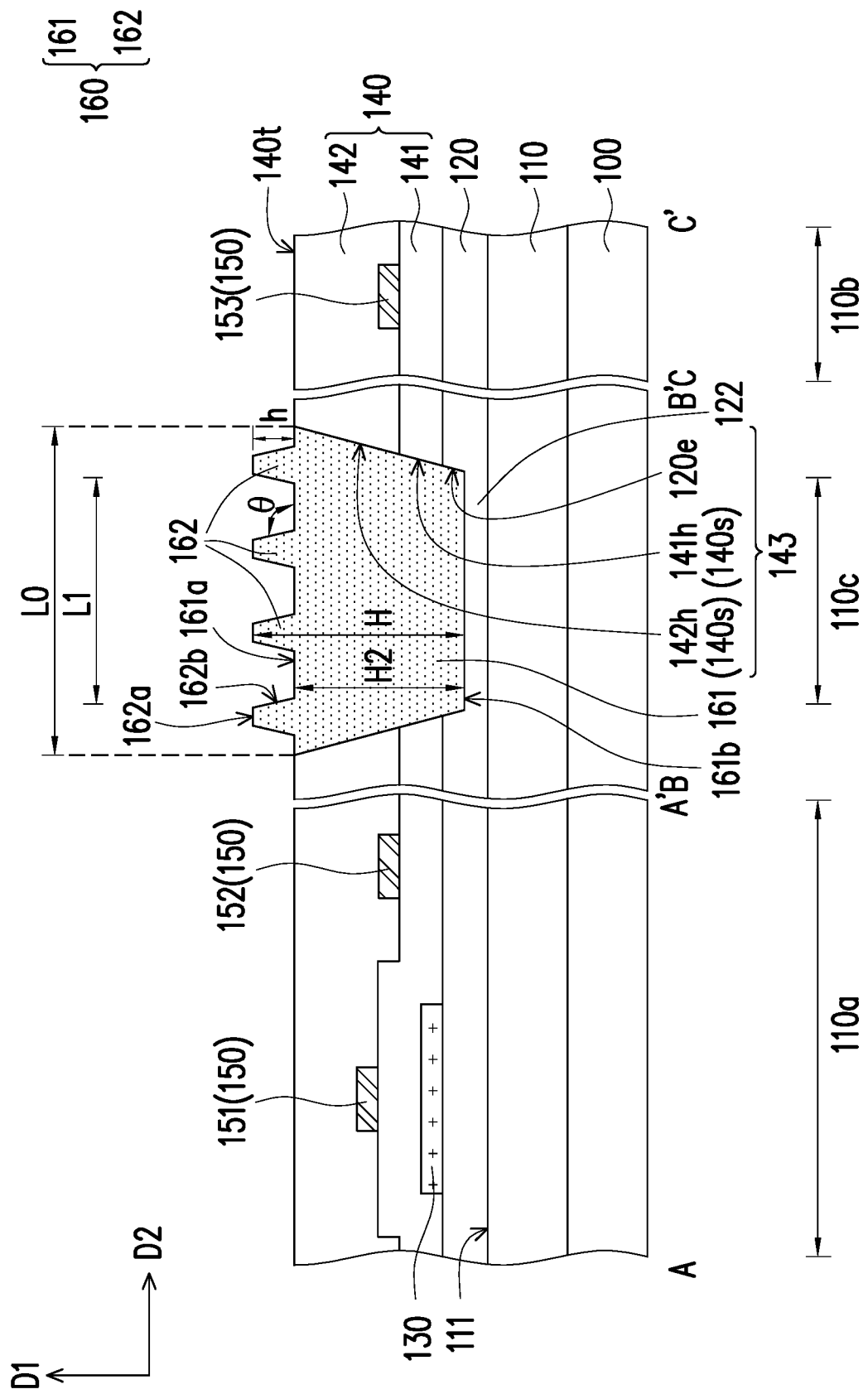

Referring to FIG. 3G, next, an organic insulation material (not shown) is filled in the first groove 143 and the organic insulation material is patterned to form an organic insulation pattern 160. In the embodiment, the organic insulation pattern 160 includes a base 161 disposed in the first groove 143 and a plurality of protrusions 162, wherein each of the protrusions 162 is disposed on a surface 161a of the base 161 and protruded toward the first direction D1 away from the flexible substrate 110. Each of the protrusions 162 has a top surface 162a and a side wall 162b away from the base 161. An angle θ is formed between the side wall 162b of each of the protrusions 162 and the surface 161a of the base 161. For example, in the embodiment, the angle θ may satisfy the following equation: 100°≤θ≤160°, but not limited thereto.

Referring to FIG. 3G, along the first direction D1, the protrusion 162 has a thickness h. In a preferable embodiment, the thickness h of the protrusion 162 may satisfy the following equation: 0.5 µm≤h≤2.5 µm, the disclosure is not limited thereto. Additionally, the top surface 162a of the protrusion 162 is spaced apart from the bottom surface 161b of the base 161 by a distance along the first direction D1. The distance is substantially equal to a sum (i.e., thickness H) of the thickness h of the protrusion 162 and the thickness (i.e., depth H2) of the base 161. In a preferable embodiment, the thickness H may satisfy the following equation: 1 µm≤H≤5 µm, but not limited thereto. For example, in the embodiment, the material of the organic insulation pattern 160 is, for example, polyimide, polyester, benzocyclobutene (BCB), polymethylmethacrylate (PMMA), poly(4-vinylphenol) (PVP), polyvinyl alcohol (PVA), polytetrafluoroethene (PTFE), hexamethyldisiloxane (HMDSO), or other suitable organic insulation material, the disclosure is not limited thereto.

In the embodiment, the surface 161a of the base 161 and the upper surface 140t of the inorganic insulation layer 140 are substantially smooth. In other words, in the embodiment, the base 161 of the organic insulation pattern 160 may fill the first groove 143; however, the disclosure is not limited thereto. In another embodiment, the surface 161a of the base 161 may be slightly higher than or slightly lower than the upper surface 140t of the inorganic insulation layer 140.

Referring to FIG. 1, FIG. 2 and FIG. 3G, in the embodiment, each of the protrusions 162 may be selectively formed in a block shape, and two adjacent rows of protrusions 162 may be selectively staggered; however, the disclosure is not limited thereto. In other embodiments, the protrusion 162 may be selectively formed in other shapes and/or other arrangement.

Figure 3H:
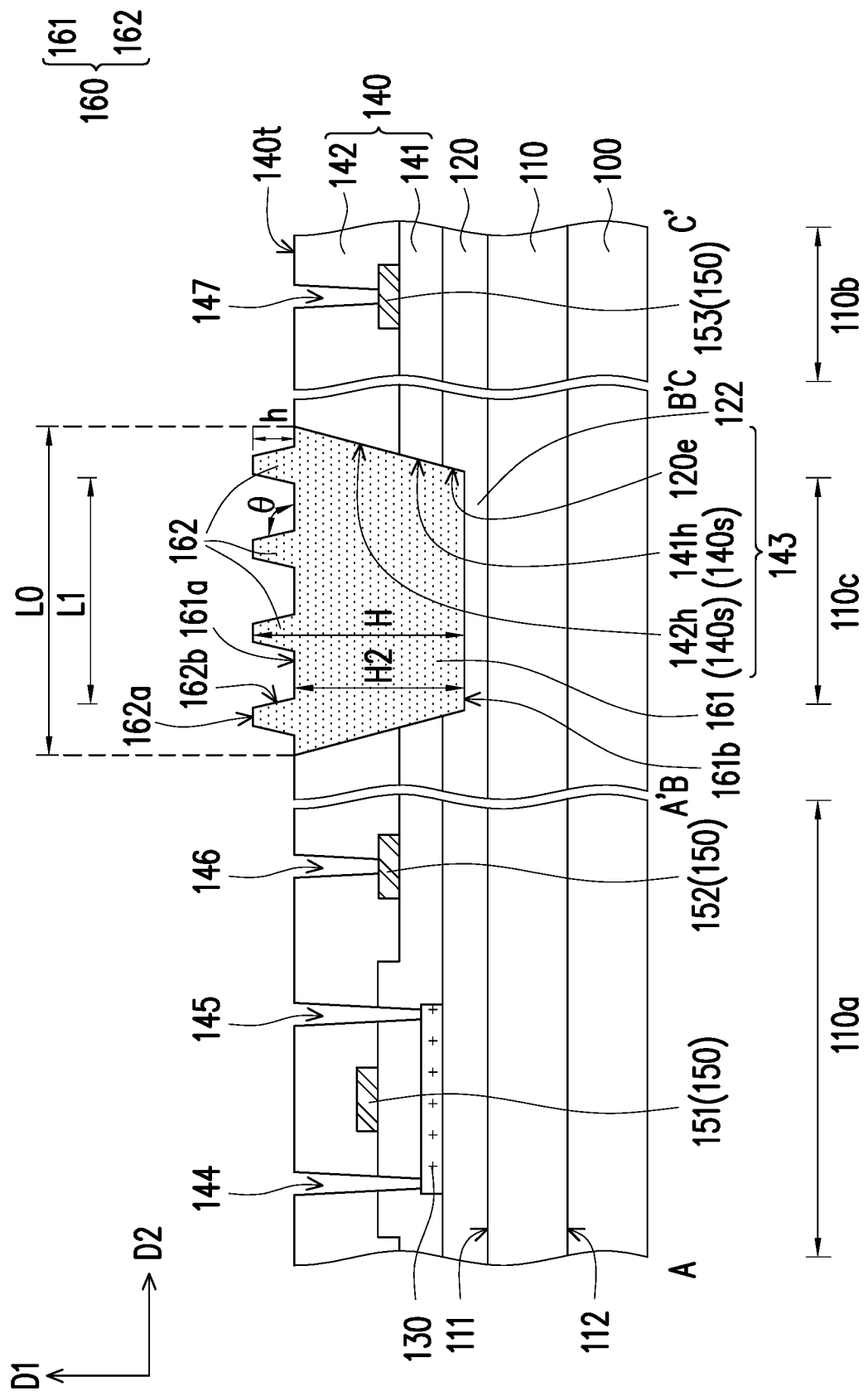

Referring to FIG. 3H, afterwards, a first through hole 144, a second through hole 145, a third through hole 146 and a fourth through hole 147 are formed in the inorganic insulation layer 140. In the embodiment, the first through hole 144 and the second through hole 145 penetrate through the first insulation layer 141 and the second insulation layer 142 to respectively expose two different regions of the semiconductor pattern 130. The third through hole 146 penetrates through the second insulation layer 142 to expose a portion of the surface of the connecting device 152. The four through hole 147 penetrates through the second insulation layer 142 to expose a portion of the surface of the conductive device 153.

Figure 3I:
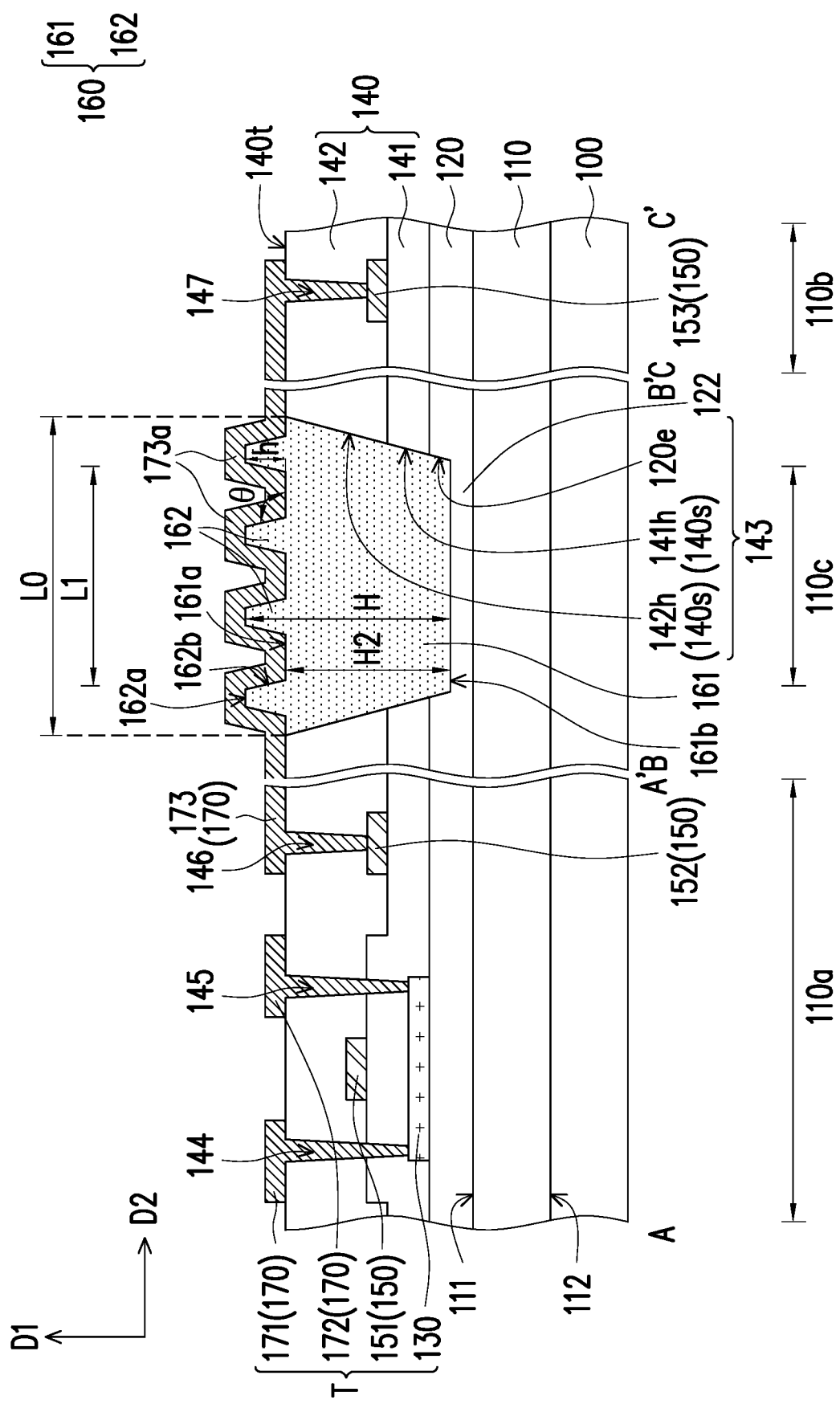

Referring to FIG. 3I, thereafter, a second conductive layer 170 is formed on the inorganic insulation layer 140 and the organic insulation pattern 160. In the embodiment, the second conductive layer 170 includes a source 171, a drain 172 and a peripheral wiring 173. Referring to FIG. 1 and FIG. 3I, in the embodiment, the second conductive layer 170 further includes a plurality of data lines DL. The data line DL is electrically connected to the source 171. In the embodiment, the peripheral wiring 173 crosses the bending region 110c and electrically connected to the scan line SL or the data line DL. For example, in the embodiment, the peripheral wiring 173 may be electrically connected to the scan line SL through the connecting device 152. The connecting device 152 is, for example, an end portion of the scan line SL; however, the disclosure is not limited thereto. In other embodiments, the peripheral wiring 173 may be electrically connected to the data line DL through the connecting device 152 or without the connecting device 152.

Referring to FIG. 3I, in the embodiment, the source 171 and the drain 172 are disposed on the second insulation layer 142 and respectively filled in the first through hole 144 and the second through hole 145 to be electrically connected to two different regions of the semiconductor pattern 130. The semiconductor pattern 130, the source 171, the drain 172 and the gate 151 constitute a thin film transistor T. In the embodiment, the thin film transistor T is exemplified as a top gate thin film transistor; however, the disclosure is not limited thereto. In other embodiments, the thin film transistor T may be a bottom gate thin film transistor or other suitable type of thin film transistor.

Referring to FIG. 1 and FIG. 3I, a portion of the peripheral wiring 173 is disposed on the organic insulation pattern 160 to cross the bending region 110c to be extended from the active region 110a to the peripheral region 110b. In the embodiment, two opposite ends of the peripheral wiring 173 are respectively filled into the third through hole 146 and the fourth through hole 147 such that the connecting device 152 on the active region 110a is electrically connected to the conductive device 153 on the peripheral region 110b through the peripheral wiring 173.

Referring to FIG. 3I, in the embodiment, in the bending region 110c, the peripheral wiring 173 may be conformally disposed on the plurality of protrusions 162 of the organic insulation pattern 160 to form a plurality of curved sections 173a protruded toward the first direction D1. The structure of the curved section 173a expedites to improve the bending tolerance of the peripheral wiring 173. In the embodiment, in consideration of conductivity, the second conductive layer 170 (or data line DL, source 171, drain 172 and peripheral wiring 173) is typically manufactured by using a metal material; however, the disclosure is not limited thereto. According to other embodiments, the second conductive layer 170 may be manufactured by using other conductive material such as alloy, nitride of metal material, oxide of metal material, oxynitride of metal material, or a stacked layer of metal material and other conductive material.

Referring to FIG. 1 and FIG. 3I, it should be pointed out that the organic insulation pattern 160 is disposed in the first groove 143 of the bending region 110c, and the peripheral wiring 173 is disposed on the organic insulation pattern 160. Since the material of the organic insulation pattern 160 is softer and not easily cracked due to bending, when the bending region 110c is bent such that the peripheral region 110b is disposed on the outer surface 112 of the active region 110a, the peripheral wiring 173 is not easily affected by the organic insulation pattern 160 to be cracked.

Figure 3J:
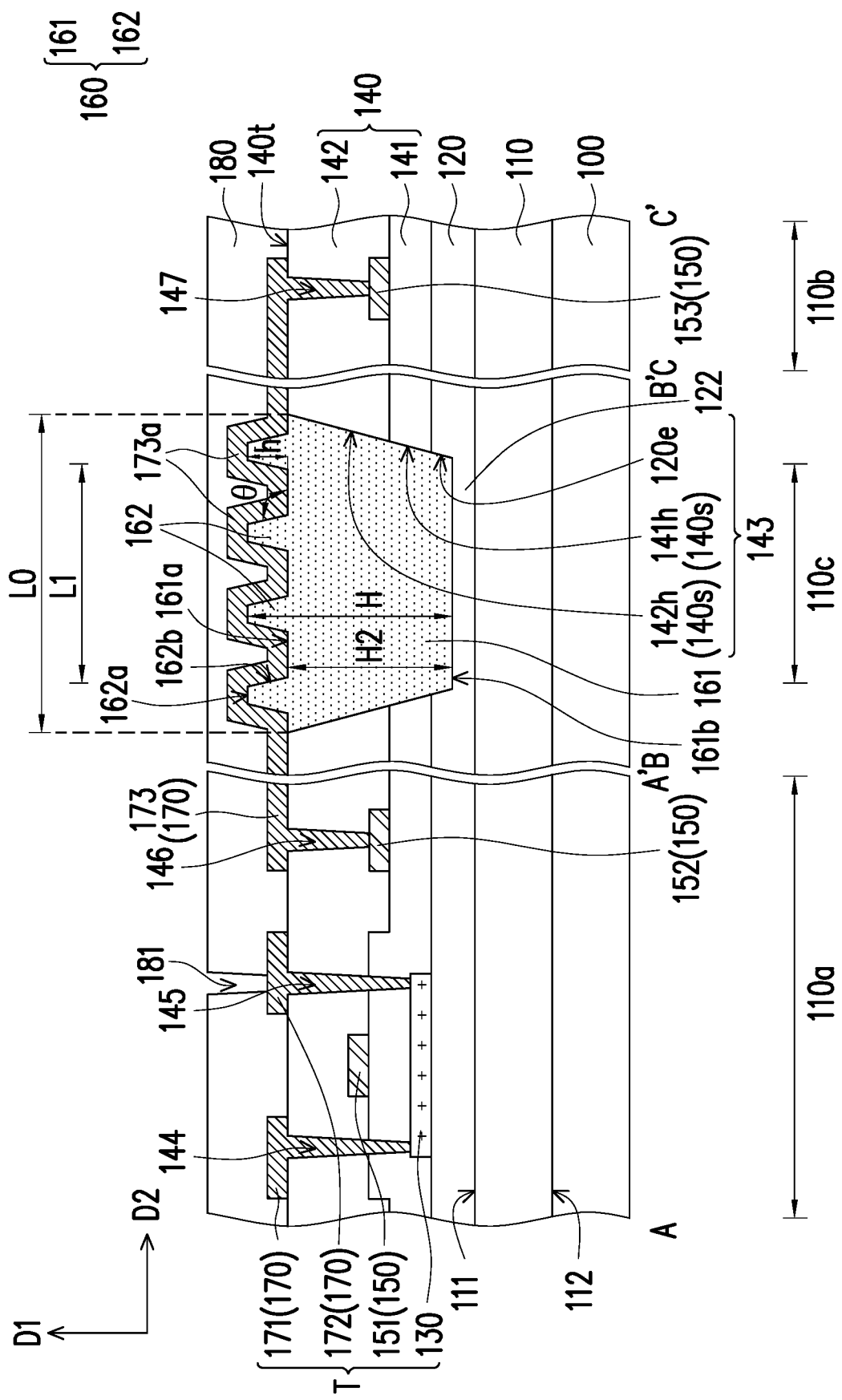

Referring to FIG. 3J, next, a planarization layer 180 is formed. The planarization layer 180 covers the source 171 of the thin film transistor T, the drain 172, the peripheral wiring 173 and the second insulation layer 142. The planarization layer 180 has a fifth through hole 181, and the fifth through hole 181 penetrates through the planarization layer 180 to expose a portion of the surface of the drain 172. In the embodiment, the material of the planarization layer 180 is, for example, an organic insulation material. The organic insulation material is, for example, polyimide, polyester, benzocyclobutene (BCB), polymethylmethacrylate (PMMA), poly(4-vinylphenol) (PVP), polyvinyl alcohol (PVA), polytetrafluoroethene (PTFE), hexamethyldisiloxane (HMDSO), or other suitable organic insulation material. The material of the planarization layer 180 and the material of the organic insulation pattern 160 may be selectively the same, the disclosure is not limited thereto.

Figure 3K:
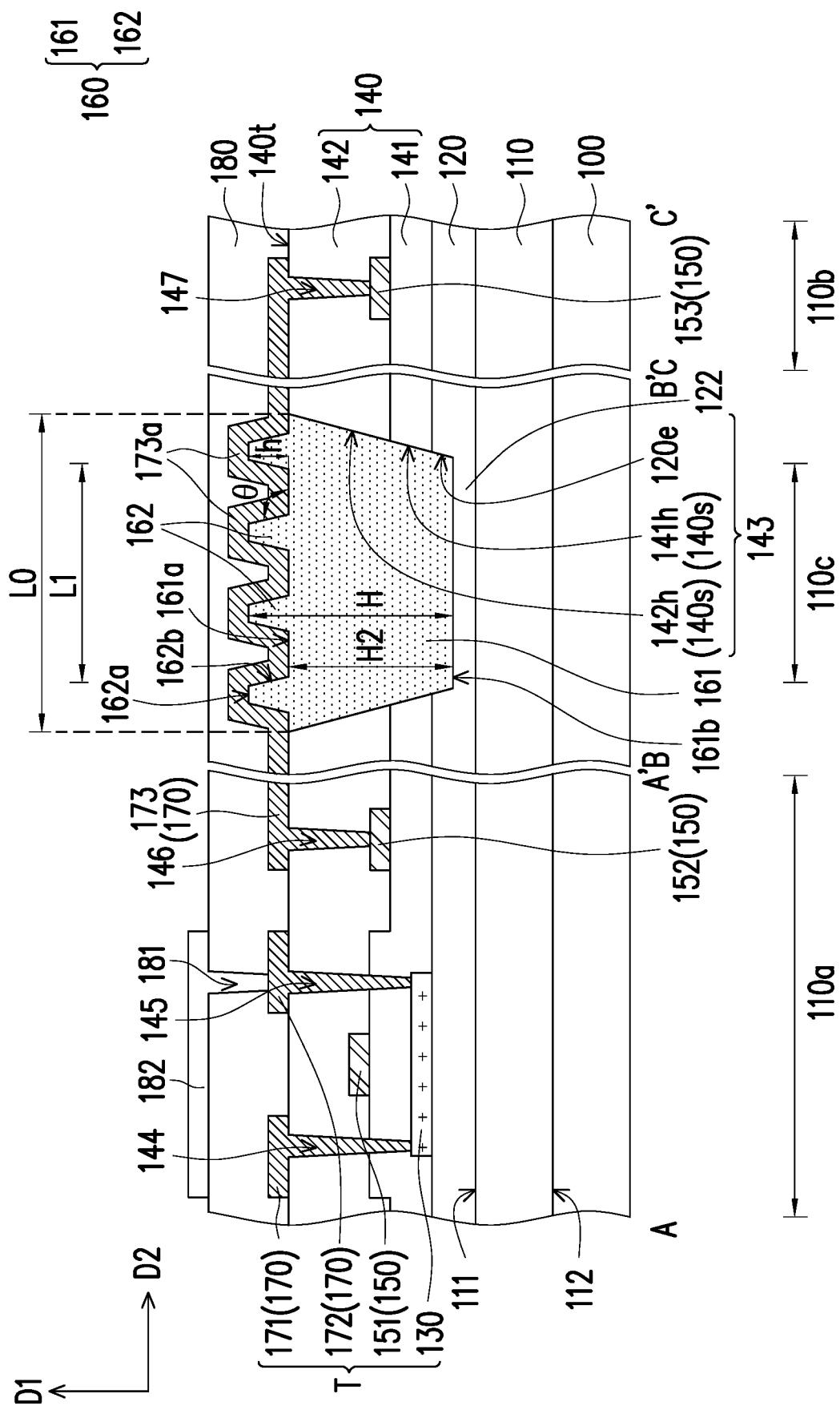

Referring to FIG. 3K, next, a first electrode 182 is formed on the planarization layer 180. The first electrode 182 is filled in the fifth through hole 181 of the planarization layer 180 to be electrically connected to the drain 172 of the thin film transistor T. For example, in the embodiment, the first electrode 182 may be a reflective electrode. The material of the reflective electrode is, for example, metal, alloy, nitride of metal material, oxide of metal material, oxynitride of metal material, or a stacked layer of metal material and other conductive material; however, the disclosure is not limited thereto. In other embodiments, the first electrode 182 may be a transparent electrode. The material of the transparent electrode is, for example, indium-tin-oxide, indium-zinc-oxide, aluminum-tin-oxide, aluminum-zinc-oxide, indium-gallium-zinc-oxide, other suitable oxide, or a stacked layer of at least two of the above materials.

Figure 3L:
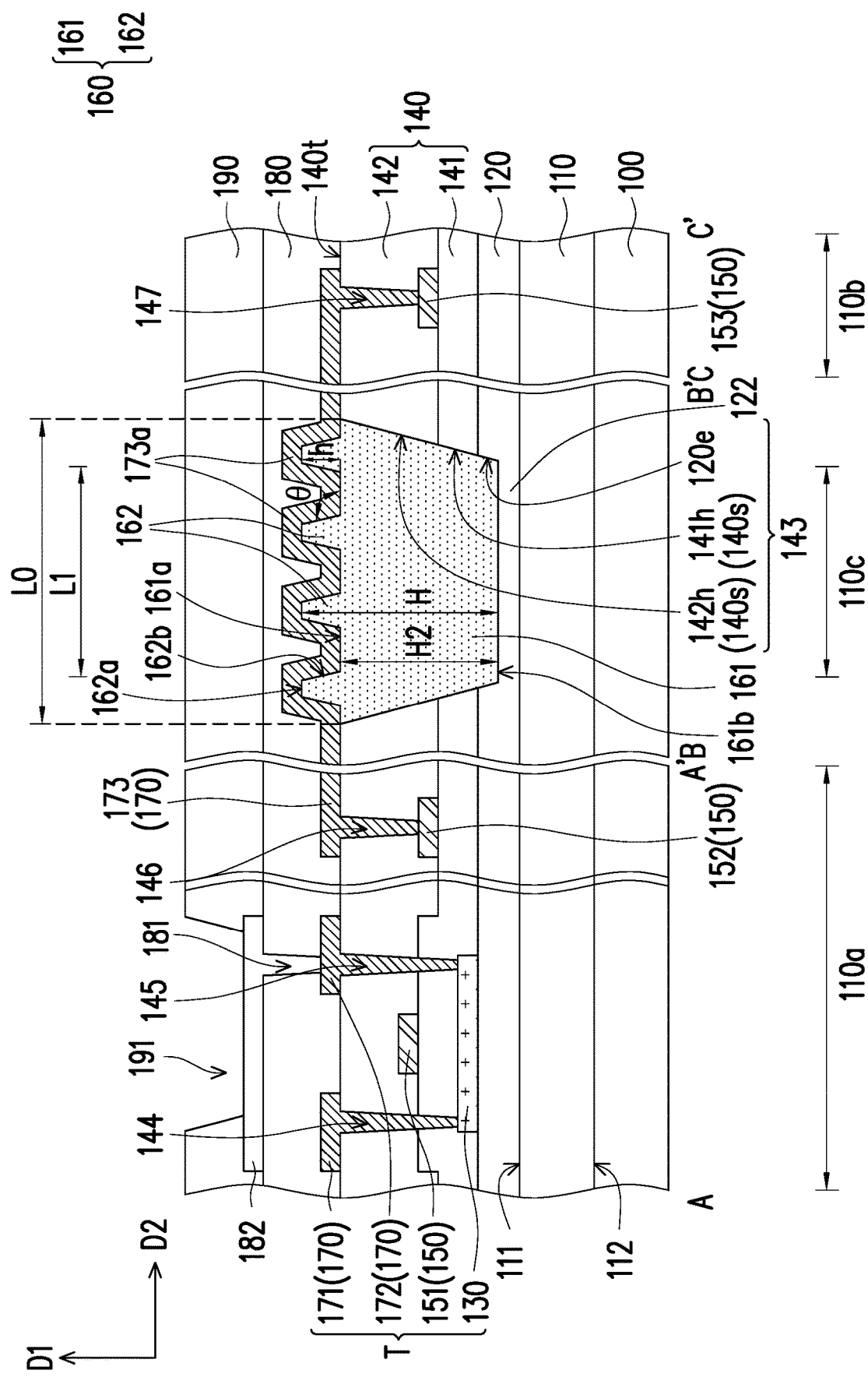

Referring to FIG. 3L, next, a pixel defining layer 190 is formed. The pixel defining layer 190 covers the planarization layer 180 and a portion of the first electrode 182. The pixel defining layer 190 has an opening 191. The opening 191 exposes a portion of the surface of the first electrode 182. In the embodiment, the material of the pixel defining layer 190 is, for example, an organic insulation material. The organic insulation material is, for example, polyimide, polyester, benzocyclobutene (BCB), polymethylmethacrylate (PMMA), poly(4-vinylphenol) (PVP), polyvinyl alcohol (PVA), polytetrafluoroethene (PTFE), hexamethyldisiloxane (HMDSO), or other suitable organic insulation material. In the embodiment, the material of the pixel defining layer 190 and the material of the organic insulation pattern 160 may be selectively the same, the disclosure is not limited thereto.

Figure 3M:
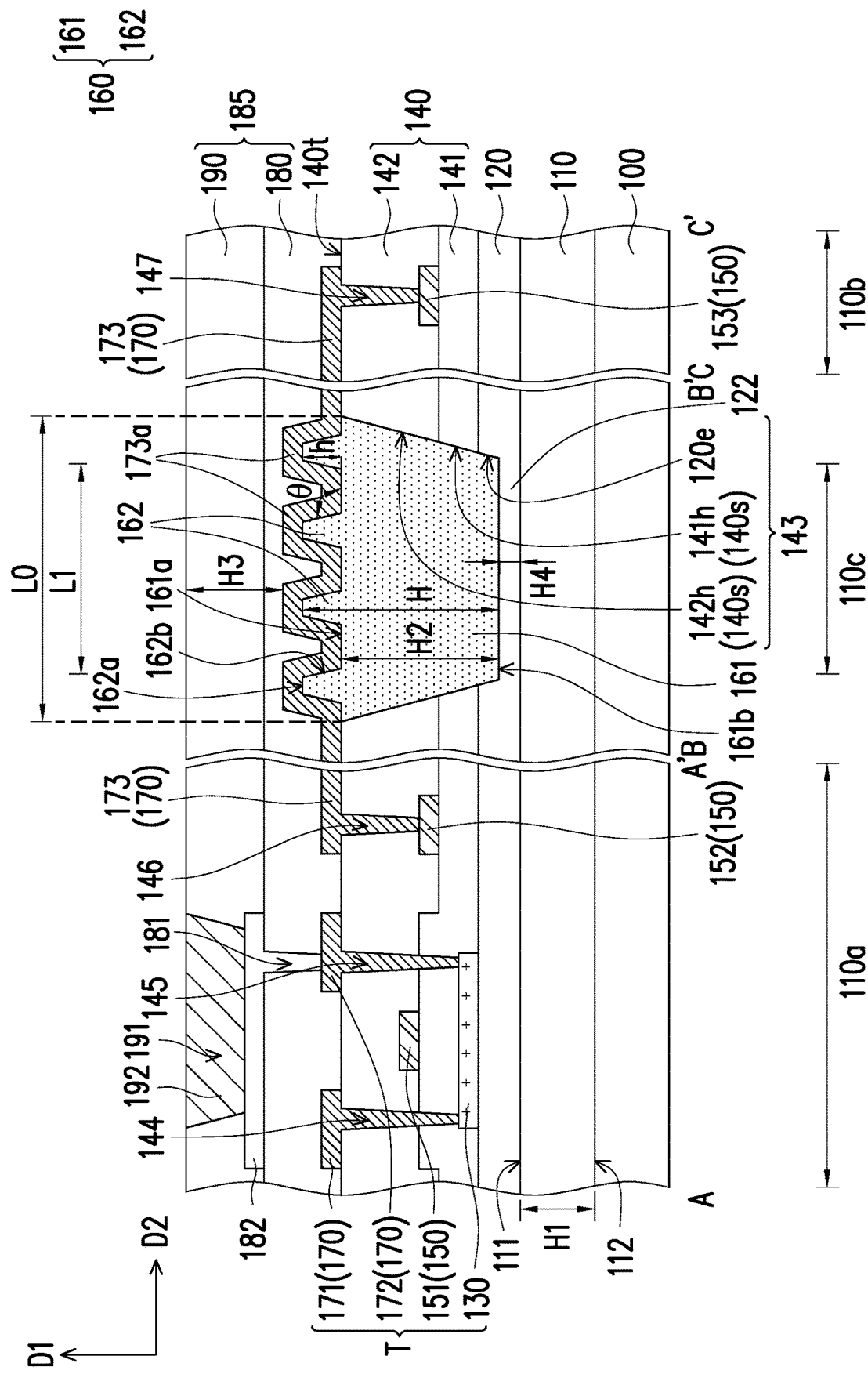

Referring to FIG. 3M, next, an electro-luminescent material is filled in the opening 191 of the pixel defining layer 190 to form a light emitting layer 192. In the embodiment, the electro-luminescent material is, for example, a phosphorescent organic electro-luminescent material, a fluorescent organic electro-luminescent material, an inorganic electro-luminescent material, or a combination of at least two of the above materials, the disclosure is not limited thereto.

Referring to FIG. 3M, in the embodiment, the flexible substrate 110 of the active device substrate 10 has a thickness H1 along the first direction D1, the base 161 of the organic insulation pattern 160 has a thickness (i.e., depth H2 of the first groove 143) along the first direction D1, the planarization layer 180 and the pixel defining layer 190 may constitute a third insulation layer 185. The third insulation layer 185 has a thickness H3 above the protrusion 162 of the organic insulation pattern 160. The thin portion of the buffer layer 120 is disposed right under the organic insulation pattern 160, and the thin portion 122 of the buffer layer 120 has a thickness H4 along the first direction D1. The flexible substrate 110, the organic insulation pattern 160, the third insulation layer 185 and the buffer layer 120 respectively have Young's modulus E1, E2, E3 and E4. In the embodiment, $H1 \cdot E1 + H2 \cdot E2 + H4 \cdot E4 \leq H3 \cdot E3$. In this manner, when the bending region 110c of the active device substrate 10 is bent, the peripheral wiring 173 that is sandwiched between the combination of the flexible substrate 110, the thin portion 122 of the buffer layer 120 and the organic insulation pattern 160 as well as the third insulation layer 185 is not easily damaged, and thus the bending tolerance of the peripheral wiring 173 is further improved.

Figure 3N:
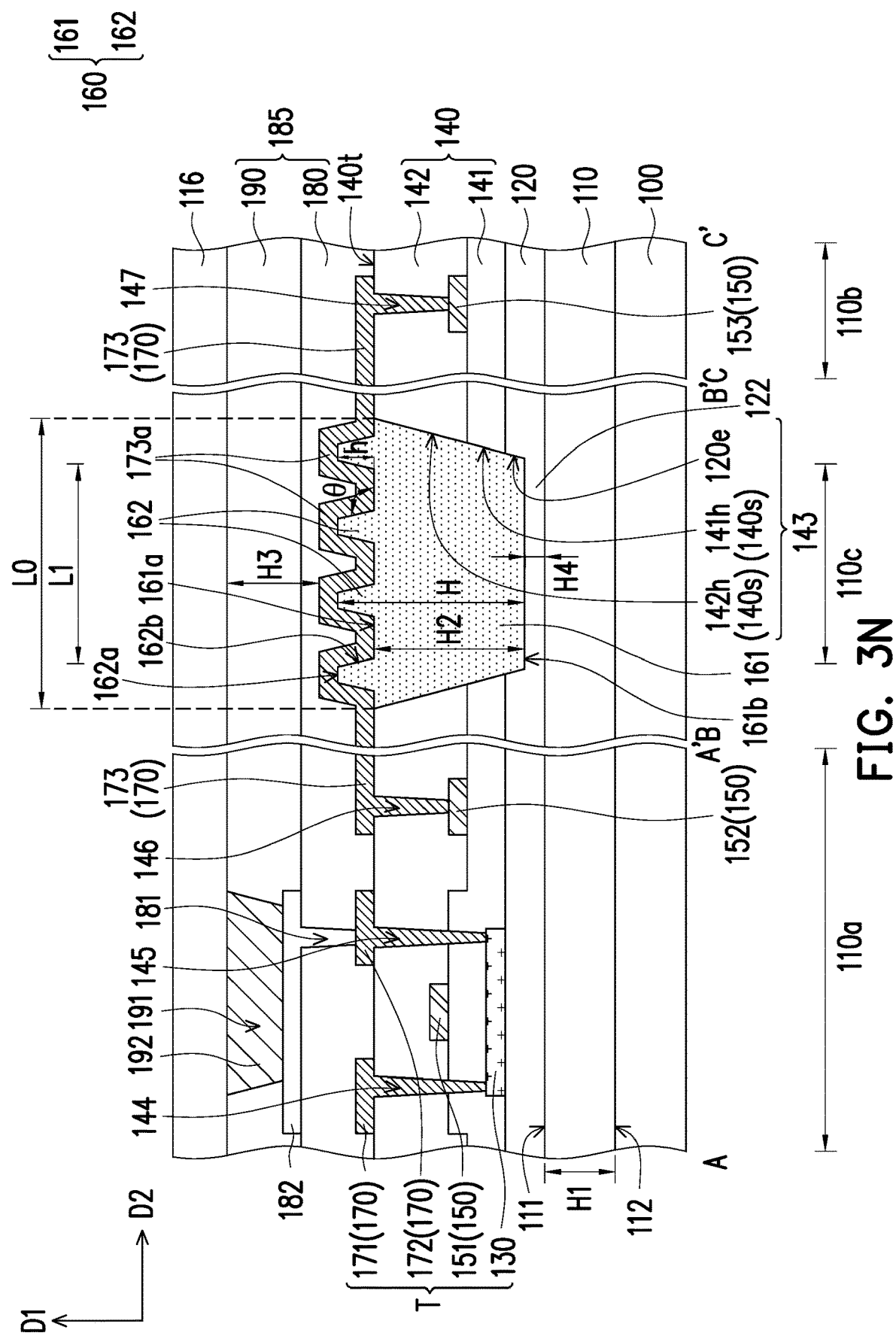
Figure 30:
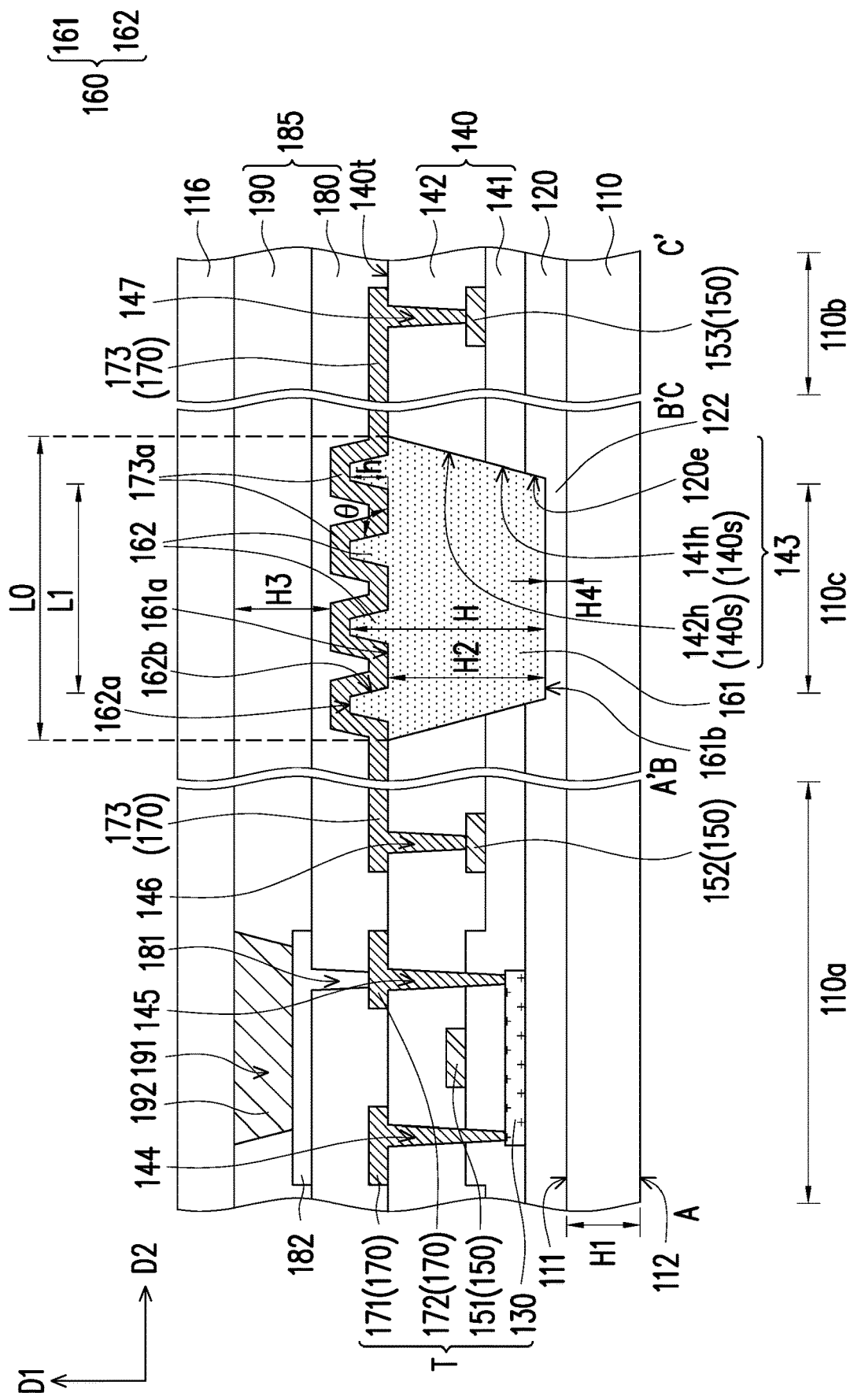
Figure 3P:
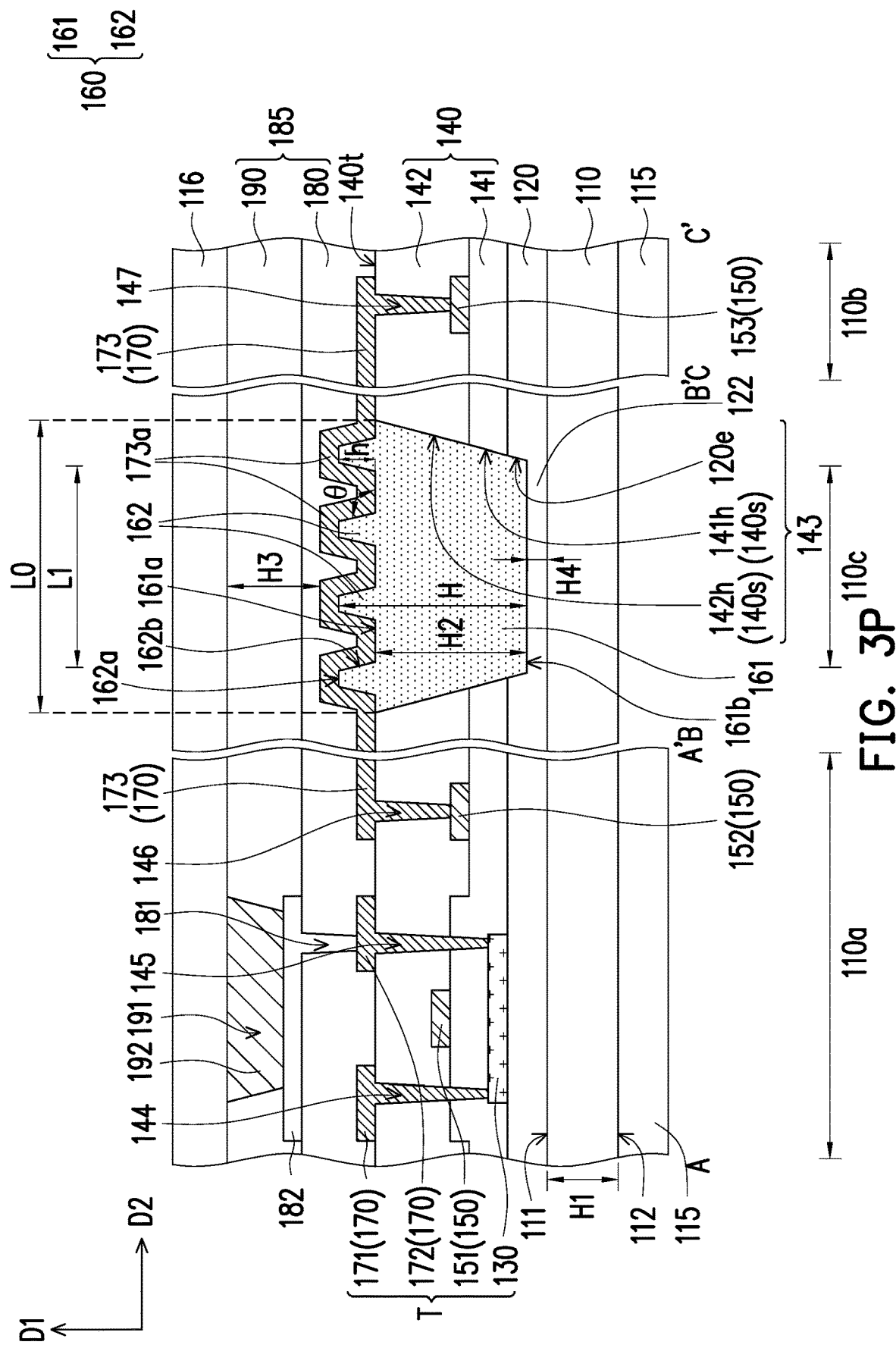
Figure 3Q:
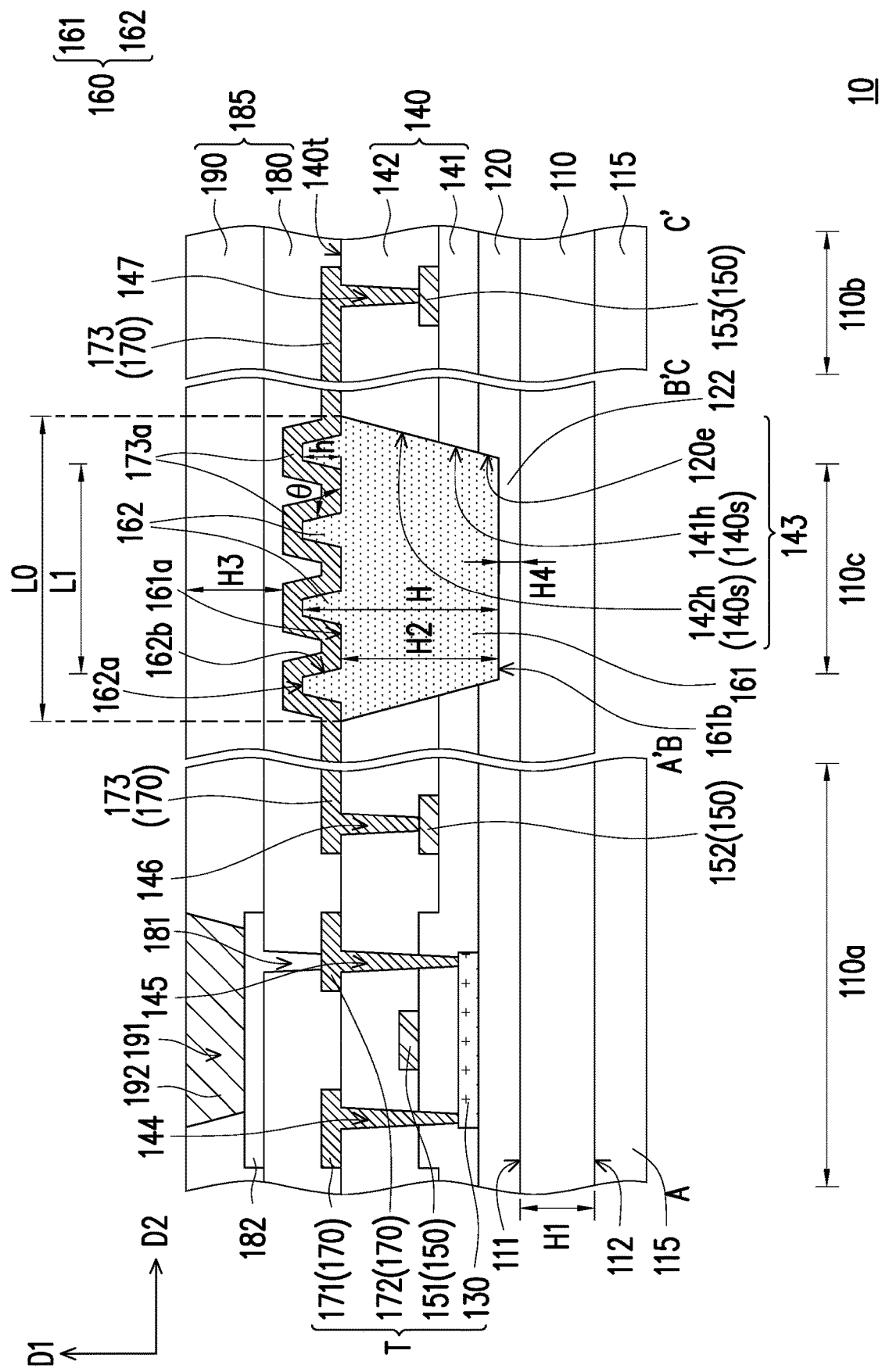

Referring to FIG. 3N, thereafter, a protecting film 116 is formed on the pixel defining layer 190 to cover the pixel defining layer 190 and the light emitting layer 192. It should be pointed out that before the protecting film 116 is disposed, other layer may be disposed depending on the needs, for example, an electrode layer is disposed to serve as an electrode layer of the light emitting layer 192, a thin film packaging layer is disposed to protect the device thereunder and etc. Referring to FIG. 3N and FIG. 3O, afterwards, the rigid carrier board 100 is lifted off to expose the outer surface 112 of the flexible substrate 110. Referring to FIG. 3P, next, a protecting film 115 is formed on the outer surface 112 of the flexible substrate 110. The protecting film 115 is disposed on the outer surface 112 of the flexible substrate 110, wherein the protecting film 115 is overlapped with the active region 110a and the peripheral region 110b without being overlapped with the bending region 110c. Referring to FIG. 3P and FIG. 3Q, thereafter, the protecting film 116 that covers the pixel defining layer 190 and the light emitting layer 192 is lifted off, thus completing the active device substrate 10 of the embodiment.

Referring to FIG. 1 and FIG. 3Q, the active device substrate 10 is bendable to be assembled within a housing of a terminal product (e.g., smart watch) and compatible with appearance design (e.g., design of round-shaped watch) of the terminal product. For example, the bending region 110c of the active device substrate 10 may be bent along a clock-wise direction (viewed from FIG. 3Q) such that the peripheral region 110b is disposed under the active region 110a. On this occasion, a portion of the protecting film 115 overlapped with the peripheral region 110b may be in contact with a portion of the protecting film 115 overlapped with the active region 110a. The peripheral region 110b and at least a portion of the bending region 110c are hidden under the active region 110a, and the bent active device substrate 10 substantially has a shape (e.g., round shape) that is compatible with the appearance design of the terminal product.

It should be indicated that the organic insulation pattern 160 is disposed in the bending region 110c of the active device substrate 10. As compared with the inorganic insulation layer 140, the organic insulation pattern 160 has better bending tolerance and is not easily cracked. In this manner, the peripheral wiring 173 that is disposed on the organic insulation pattern 160 is not easily affected and cracked and thus can maintain normal operation of the active device substrate 10 under the state that the bending region 110c is bent.

Figure 4:
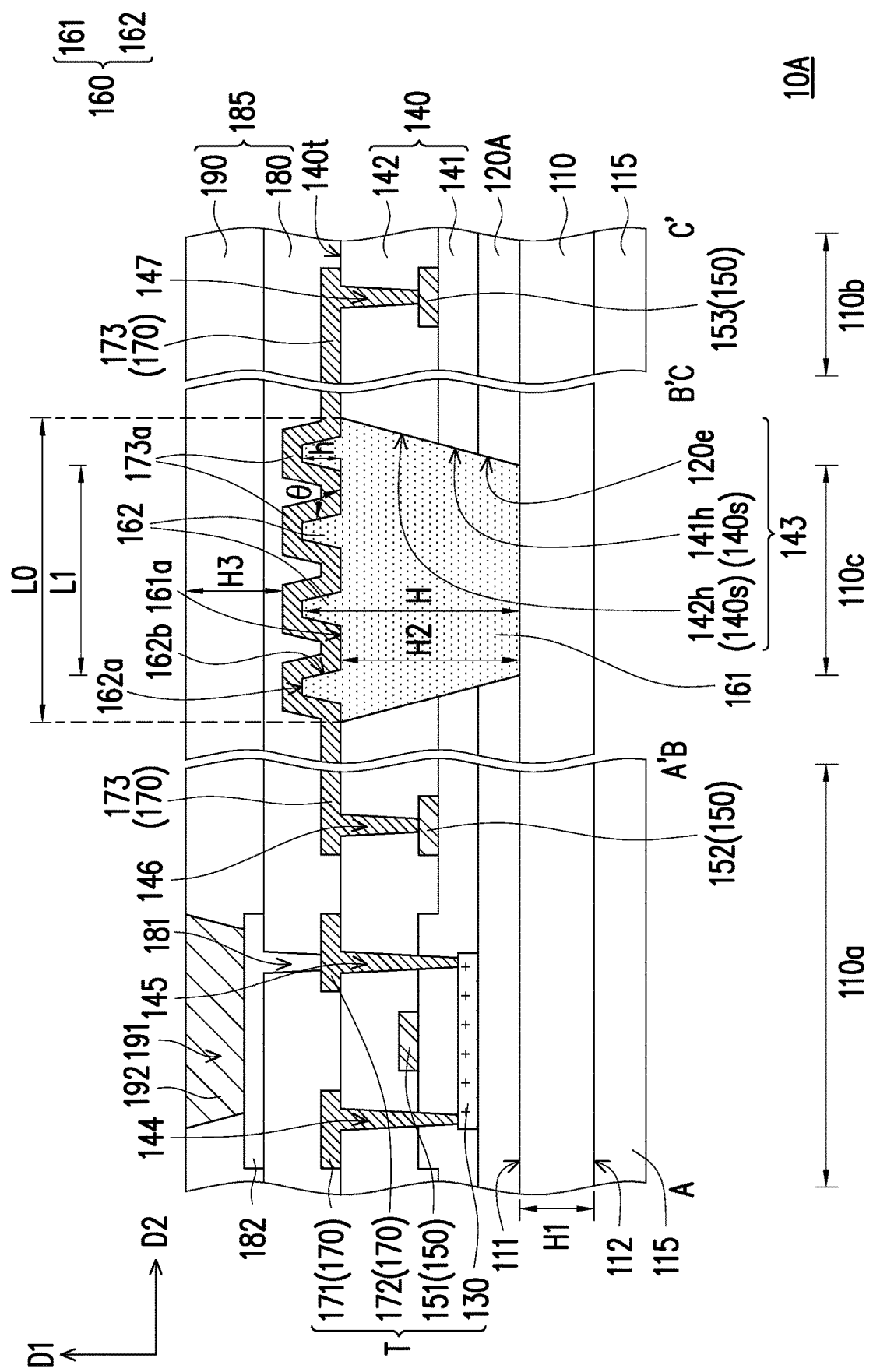
FIG. 4 is a schematic cross-sectional view of an active device substrate 10A according to another embodiment of the disclosure.

FIG. 4 is a schematic cross-sectional view of an active device substrate 10A according to another embodiment of the disclosure. Referring to FIG. 4, an active device substrate 10A in FIG. 4 is similar to the active device substrate 10 in FIG. 3M, and the difference between the two is that, in the embodiment of FIG. 4, the base 161 of the organic insulation pattern 160 penetrates through the buffer layer 120A, and the organic insulation pattern 160 is directly in contact with the flexible substrate 110. Additionally, in the embodiment, $H1 \cdot E1 + H2 \cdot E2 \leq H3 \cdot E3$.

Figure 5:
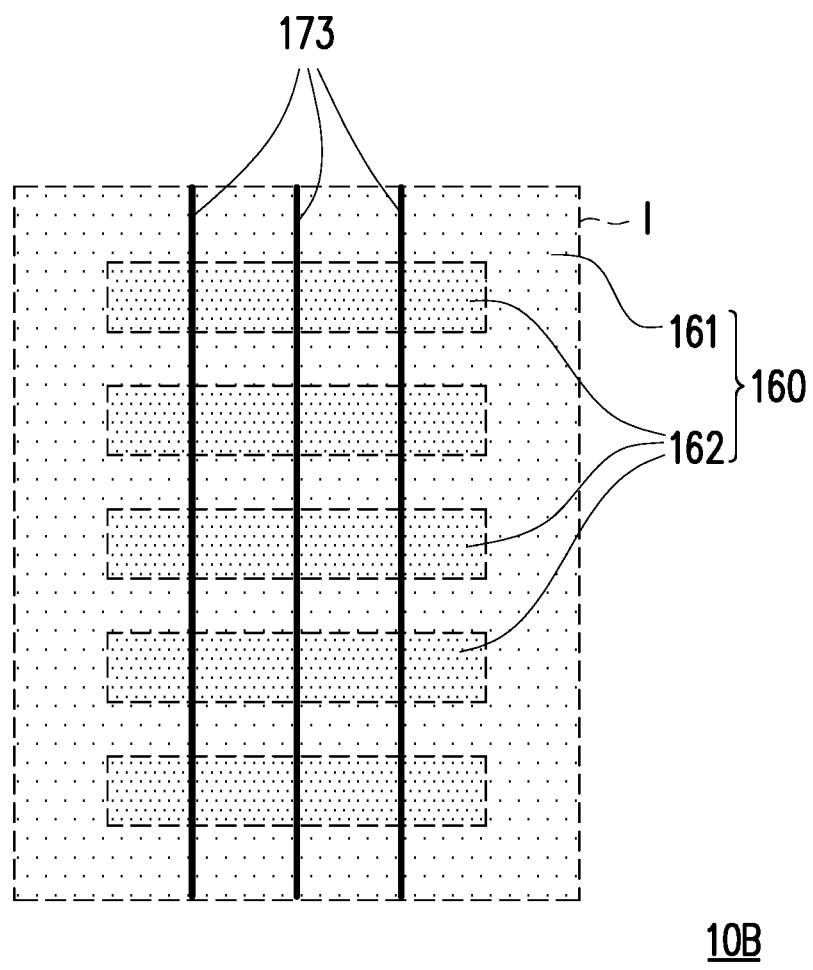
FIG. 5 is an enlarged schematic top view of a partial region I of a bending region 110c of an active device substrate 10B according to another embodiment of the disclosure.

FIG. 5 is an enlarged schematic top view of a partial region I of a bending region 110c of an active device substrate 10B according to another embodiment of the disclosure. Referring to FIG. 5, in the embodiment, the protrusion 162 of the organic insulation pattern 160 may be an extended stripe structure perpendicular to the second direction D2.

Figure 6:
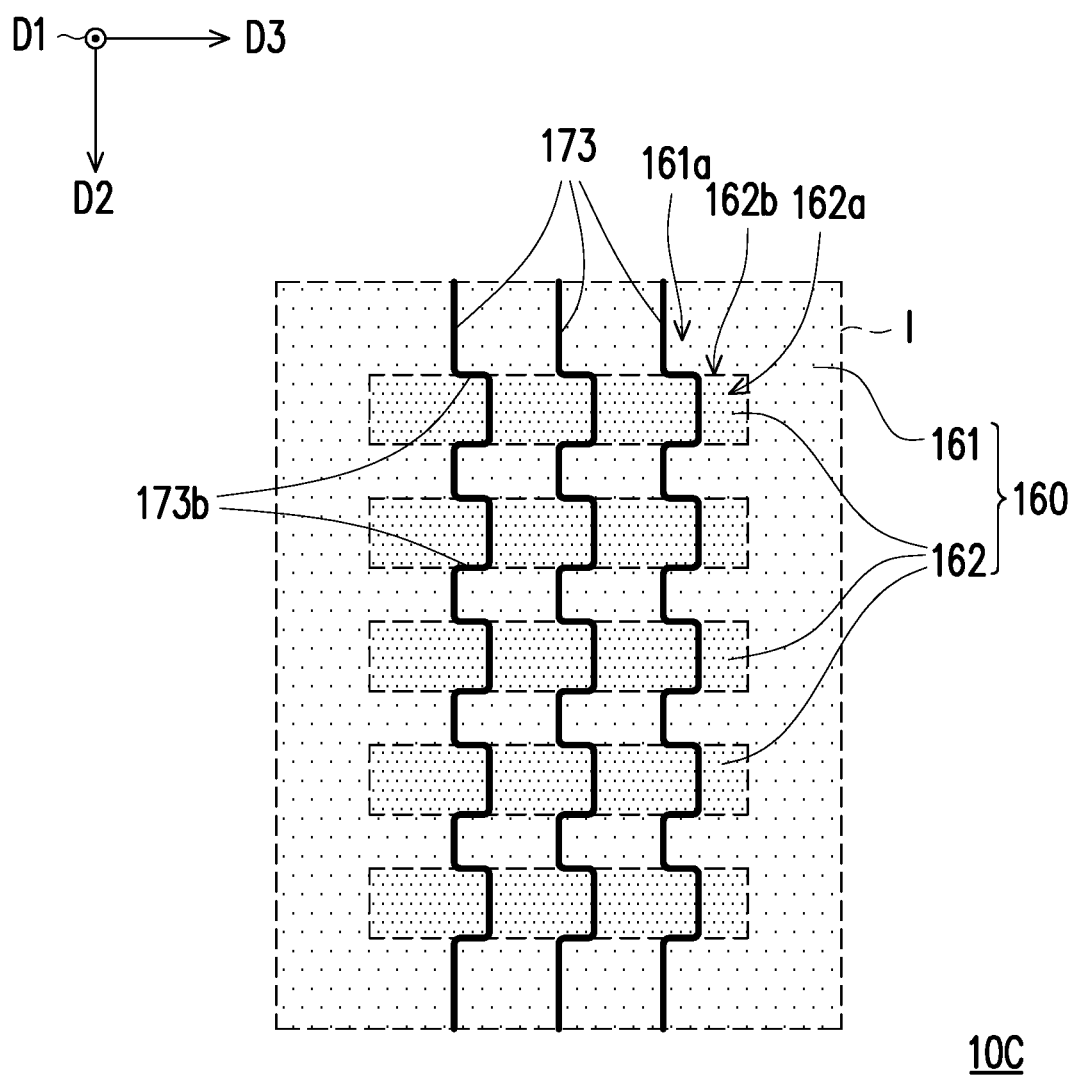
FIG. 6 is an enlarged schematic top view of a partial region I of a bending region of an active device substrate 10C according to still another embodiment of the disclosure.

FIG. 6 is an enlarged schematic top view of a partial region I of a bending region of an active device substrate 10C according to still another embodiment of the disclosure. An active device substrate 10C in FIG. 6 is similar to the active device substrate 10B in FIG. 5, and the difference between the two is that a plurality of curved sections 173b of the peripheral wiring 173 are not only bent along the first direction D1 but also bent along a third direction D3, wherein the third direction D3 is parallel with the inner surface 111 of the flexible substrate 110 and perpendicular to the second direction D2. In this manner, when the peripheral wiring 173 is extended from the surface 161a of the base 161 of the organic insulation pattern 160 to the top surface 162a of the adjacent protrusion 162, the length of the peripheral wiring 173 on the side wall 162b of the two adjacent protrusions 162 can be increased, thereby enhancing the bending tolerance of the peripheral wiring 173.

Figure 7:
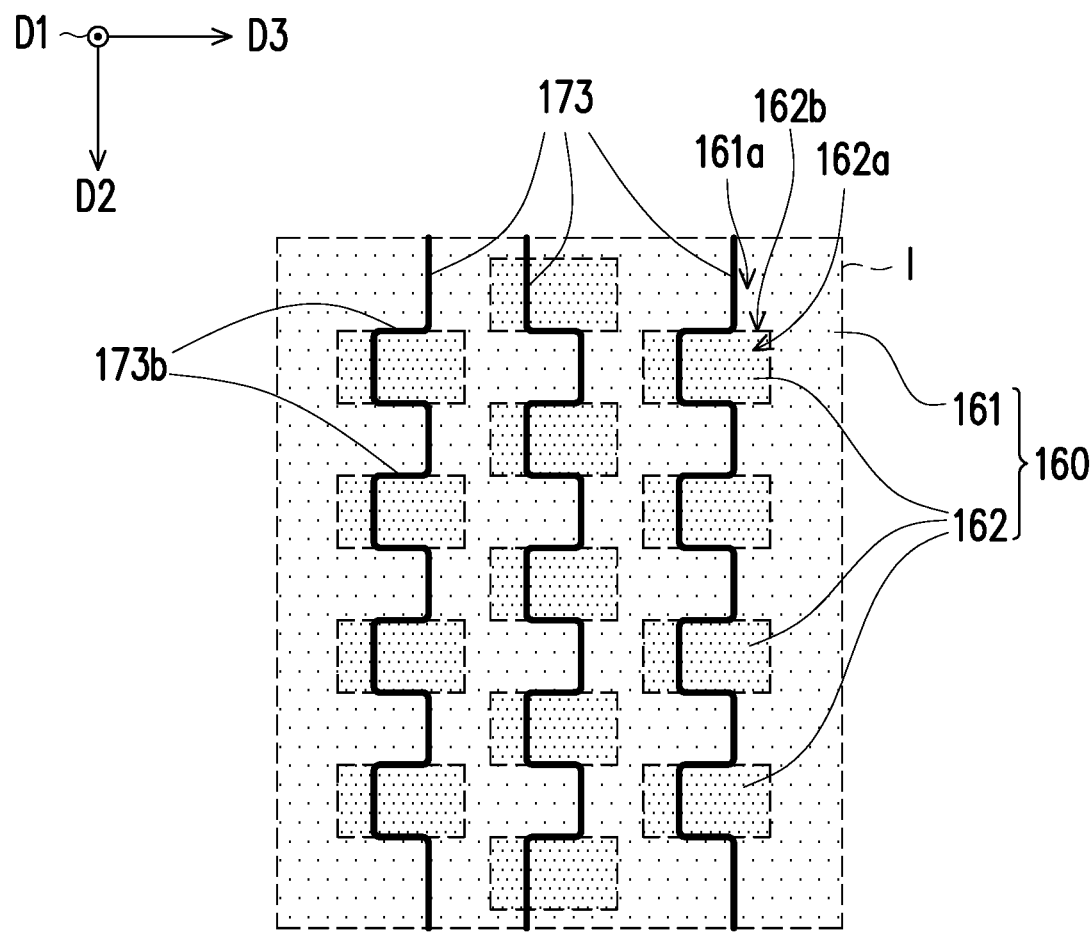
FIG. 7 is an enlarged schematic top view of a partial region I of a bending region of an active device substrate 10D according to yet another embodiment of the disclosure.

FIG. 7 is an enlarged schematic top view of a partial region I of a bending region of an active device substrate 10D according to yet another embodiment of the disclosure. An active device substrate 10D in FIG. 7 is similar to the active device substrate 10C in FIG. 6, and the difference between the two is that, in the embodiment of FIG. 7, each of the protrusions 162 may be selectively formed in a block shape, and the two adjacent rows of protrusions 162 may be selectively staggered.

In summary, the active device substrate in the embodiment of the disclosure is provided with the organic insulation pattern in the first groove of the bending region. The peripheral wiring is disposed on the organic insulation pattern to cross the bending region and is extended from the active region to the peripheral region. Since the material of the organic insulation pattern is softer and not easily cracked due to bending, when the bending region is bent, the peripheral wiring is not easily affected by the organic insulation pattern to be cracked, and thus the active device substrate has good bending tolerance.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An active device substrate, comprising:
    a flexible substrate, having an active region, a peripheral region outside the active region and a bending region connected between the active region and the peripheral region;
    an inorganic insulation layer, disposed on the flexible substrate, and the inorganic insulation layer having a first groove disposed in the bending region;
    an organic insulation pattern, disposed in the first groove of the inorganic insulation layer;
    a conductive device, disposed on the peripheral region;
    a buffer layer, covering the active region and the bending region; and
    a peripheral wiring, extended from the active region to the conductive device located in the peripheral region, wherein the peripheral wiring located in the bending region is disposed on the organic insulation pattern, and the organic insulation pattern is disposed between the peripheral wiring and the flexible substrate, wherein a thickness of a portion of the buffer layer covering the bending region is thinner than a thickness of a portion of the buffer layer covering the active region, wherein the organic insulation pattern further comprises a base, the base is disposed in the first groove of the inorganic insulation layer, the base has a surface facing away from the flexible substrate, and the surface of the base and an upper surface of the inorganic insulation layer are substantially coplanar.

2. The active device substrate according to claim 1, further comprising a thin film transistor disposed on the active region, wherein the thin film transistor comprises:
    a semiconductor pattern, disposed on the flexible substrate;
    a gate;
    a source and a drain, disposed above the gate and electrically connected to the semiconductor pattern.

3. The active device substrate according to claim 2, wherein the inorganic insulation layer comprises:
    a first insulation layer, covering the semiconductor pattern; and
    a second insulation layer, covering the gate and the first insulation layer, wherein the first groove penetrates through the first insulation layer and the second insulation layer.

4. The active device substrate according to claim 3, wherein the inorganic insulation layer further comprises a first through hole and a second through hole, the source and the drain are disposed on the inorganic insulation layer and respectively electrically connected to the semiconductor pattern through the first through hole and the second through hole, and the peripheral wiring, the source and the drain belong to an identical layer.

5. The active device substrate according to claim 3, wherein the organic insulation pattern has an upper surface facing away from the flexible substrate, the second insulation layer has an upper surface facing away from the flexible substrate, and a distance between the upper surface of the organic insulation pattern and the flexible substrate is larger than or equal to a distance between the upper surface of the second insulation layer and the flexible substrate.

6. The active device substrate according to claim 1, wherein an upper surface of the organic insulation pattern has a plurality of protrusions, and the peripheral wiring is conformally disposed on the protrusions.

7. The active device substrate according to claim 2, further comprising:
    a planarization layer, covering the thin film transistor;
    a first electrode, disposed on the planarization layer and electrically connected to the drain of the thin film transistor; and
    a pixel defining layer, disposed on the planarization layer and the first electrode, and having an opening overlapped with a portion of the first electrode.

8. The active device substrate according to claim 7, wherein the planarization layer covers the peripheral wiring, and the pixel defining layer covers the planarization layer disposed on the peripheral wiring.

9. The active device substrate according to claim 7, wherein a material of the planarization layer, a material of the pixel defining layer and a material of the organic insulation layer are identical.

10. The active device substrate according to claim 2, wherein the inorganic insulation layer comprises:
    a first insulation layer, covering the semiconductor pattern; and
    a second insulation layer, covering the gate and the first insulation layer, wherein the first groove penetrates through the first insulation layer and the second insulation layer;
    wherein the organic insulation pattern is disposed on the portion of the buffer layer covering the bending region, the active device substrate further comprises a third insulation layer, the third insulation layer covers the peripheral wiring and the second insulation layer, the flexible substrate has a thickness H1 and a Young's modulus E1, the first groove has a depth H2, the organic insulation pattern has a Young's modulus E2, the third insulation layer has a thickness H3 and a Young's modulus E3, the portion of the buffer layer covering the bending region has a thickness H4 and a Young's modulus E4, and $H1 \cdot E1 + H2 \cdot E2 \le H3 \cdot E3$.

11. The active device substrate according to claim 1, wherein the organic insulation pattern has a plurality of protrusions, the protrusions are protruded toward a first direction away from the flexible substrate, and the peripheral wiring is disposed on the protrusions.

12. The active device substrate according to claim 11, wherein the peripheral wiring has a plurality of curved sections, each of the curved sections is bent toward a second direction, and the first direction and the second direction interlace each other.

13. The active device substrate according to claim 11, wherein the protrusions of the organic insulation pattern are arranged in a plurality of rows, and two adjacent rows of the plurality of protrusions are staggered.

14. The active device substrate according to claim 11, wherein the peripheral wiring has a plurality of curved sections, and the curved sections of the peripheral wiring are respectively disposed on the protrusions of the organic insulation pattern.

15. The active device substrate according to claim 11, wherein the organic insulation pattern further comprises a base, the base is disposed in the first groove of the inorganic insulation layer, the protrusions are disposed on a surface of the base, an angle θ is formed between a side wall of each of the protrusions and the surface of the base, and $100°≤θ≤160°$.

16. The active device substrate according to claim 11, wherein the organic insulation pattern further comprises a base, the base is disposed in the first groove of the inorganic insulation layer, the protrusions are disposed on a surface of the base, the protrusions have a thickness h, a sum of the thickness h and a thickness of the base is H, and $0.5 \mu m ≤ h ≤ 2.5 \mu m$, and $1 \mu m ≤ H ≤ 5 \mu m$.

17. The active device substrate according to claim 2, wherein the flexible substrate has an inner surface and an outer surface opposite to each other, the thin film transistor is disposed on the inner surface of the flexible substrate, the active device substrate further comprising:
   a protecting film, disposed on the outer surface of the flexible substrate, wherein the protecting film is overlapped with the active region and peripheral region without being overlapped with the bending region.

18. The active device substrate according to claim 1, wherein along a direction directing from the active region to the peripheral region, the first groove has a width L0 (μm), the bending region has a width L1(μm), and $L1+20 \mu m < L0 < 3 \cdot L1$.

* * * * *